US009299583B1

(12) United States Patent
Wang et al.

(10) Patent No.: US 9,299,583 B1
(45) Date of Patent: Mar. 29, 2016

(54) ALUMINUM OXIDE SELECTIVE ETCH

(71) Applicant: Applied Materials, Inc., Santa Clara, CA (US)

(72) Inventors: Xikun Wang, Sunnyvale, CA (US); Anchuan Wang, San Jose, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/562,402

(22) Filed: Dec. 5, 2014

(51) Int. Cl.
*H01L 21/311* (2006.01)

(52) U.S. Cl.
CPC ................................ *H01L 21/31122* (2013.01)

(58) Field of Classification Search
None
See application file for complete search history.

(56) References Cited

U.S. PATENT DOCUMENTS 2,369,620 A 2/1945 Sullivan et al.
3,451,840 A 6/1969 Hough
3,937,857 A 2/1976 Brummett et al.
4,006,047 A 2/1977 Brummett et al.
4,209,357 A 6/1980 Gorin et al.
4,214,946 A 7/1980 Forget et al.
4,232,060 A 11/1980 Mallory, Jr.
4,234,628 A 11/1980 DuRose
4,265,943 A 5/1981 Goldstein et al.
4,364,803 A 12/1982 Nidola et al.
4,368,223 A 1/1983 Kobayashi et al.
4,397,812 A 8/1983 Mallory, Jr.
4,468,413 A 8/1984 Bachmann
4,565,601 A 1/1986 Kakehi et al.
4,579,618 A 4/1986 Celestino et al.
4,585,920 A 4/1986 Hoog et al.
4,625,678 A 12/1986 Shioya et al.
4,632,857 A 12/1986 Mallory, Jr.
4,656,052 A 4/1987 Satou et al.
4,690,746 A 9/1987 McInerney et al.
4,715,937 A 12/1987 Moslehi et al.
4,749,440 A 6/1988 Blackwood et al.
4,753,898 A 6/1988 Parrillo et al.
4,786,360 A 11/1988 Cote et al.
4,793,897 A 12/1988 Dunfield et al.
4,807,016 A 2/1989 Douglas
4,810,520 A 3/1989 Wu
4,816,638 A 3/1989 Ukai et al.
4,820,377 A 4/1989 Davis et al.
4,851,370 A 7/1989 Doklan et al.
4,865,685 A 9/1989 Palmour
4,868,071 A 9/1989 Walsh et al.
4,872,947 A 10/1989 Wang et al.
4,878,994 A 11/1989 Jucha et al.
4,886,570 A 12/1989 Davis et al.
4,892,753 A 1/1990 Wang et al.
4,894,352 A 1/1990 Lane et al.
4,904,341 A 2/1990 Blaugher et al.
4,904,621 A 2/1990 Loewenstein et al.

(Continued)

*Primary Examiner* — Allan Olsen

(74) *Attorney, Agent, or Firm* — Kilpatrick Townsend & Stockton LLP

(57) ABSTRACT

Methods of selectively etching aluminum oxide from the surface of a patterned substrate are described. The etch selectively removes aluminum oxide relative to other metal oxides and silicon-containing films such as silicon, polysilicon, silicon oxide, silicon germanium and/or silicon nitride. The methods include exposing aluminum oxide to plasma effluents formed in a remote plasma from a chlorine-containing precursor and a hydrocarbon. A remote plasma is used to excite the precursors and a local plasma is used to further excite the plasma effluents and accelerate ions toward the patterned substrate.

15 Claims, 7 Drawing Sheets

101

110 Place Substrate with Exposed Portions of Aluminum Oxide in a Substrate Processing Region 120 Combine Chlorine and Methane in Remote Plasma Region and apply Remote Plasma Power 130 Flow Plasma Effluents into Substrate Processing Region 140 Apply Low Plasma Power to Lightly Bias Plasma Effluents towards Substrate 150 Selectively Etch Aluminum Oxide from the Substrate 160 Remove Substrate from Processing Region

(56) References Cited

U.S. PATENT DOCUMENTS 4,913,929 A 4/1990 Moslehi et al.
4,951,601 A 8/1990 Maydan et al.
4,960,488 A 10/1990 Law et al.
4,980,018 A 12/1990 Mu et al.
4,981,551 A 1/1991 Palmour
4,985,372 A 1/1991 Narita et al.
4,992,136 A 2/1991 Tachi et al.
4,994,404 A 2/1991 Sheng et al.
5,000,113 A 3/1991 Wang et al.
5,013,691 A 5/1991 Lory et al.
5,030,319 A 7/1991 Nishino et al.
5,061,838 A 10/1991 Lane et al.
5,089,441 A 2/1992 Moslehi
5,089,442 A 2/1992 Olmer
5,147,692 A 9/1992 Bengston
5,156,881 A 10/1992 Okano et al.
5,180,435 A 1/1993 Markunas et al.
5,186,718 A 2/1993 Tepman et al.
5,188,706 A 2/1993 Hori et al.
5,198,034 A 3/1993 deBoer et al.
5,203,911 A 4/1993 Sricharoenchaikit et al.
5,215,787 A 6/1993 Homma
5,228,501 A 7/1993 Tepman et al.
5,231,690 A 7/1993 Soma et al.
5,235,139 A 8/1993 Bengston et al.
5,238,499 A 8/1993 van de Ven et al.
5,240,497 A 8/1993 Shacham et al.
5,248,527 A 9/1993 Uchida et al.
5,252,178 A 10/1993 Moslehi
5,266,157 A 11/1993 Kadomura
5,270,125 A 12/1993 America et al.
5,271,972 A 12/1993 Kwok et al.
5,275,977 A 1/1994 Otsubo et al.
5,279,865 A 1/1994 Chebi et al.
5,288,518 A 2/1994 Homma
5,290,382 A 3/1994 Zarowin et al.
5,300,463 A 4/1994 Cathey et al.
5,302,233 A 4/1994 Kim et al.
5,306,530 A 4/1994 Strongin et al.
5,314,724 A 5/1994 Tsukune et al.
5,319,247 A 6/1994 Matsuura
5,326,427 A 7/1994 Jerbic
5,328,218 A 7/1994 Lowrey et al.
5,328,558 A 7/1994 Kawamura et al.
5,334,552 A 8/1994 Homma
5,345,999 A 9/1994 Hosokawa
5,352,636 A 10/1994 Beinglass
5,356,478 A 10/1994 Chen et al.
5,362,526 A 11/1994 Wang et al.
5,368,897 A 11/1994 Kurihara et al.
5,380,560 A 1/1995 Kaja et al.
5,382,311 A 1/1995 Ishikawa et al.
5,384,284 A 1/1995 Doan et al.
5,385,763 A 1/1995 Okano et al.
5,399,237 A 3/1995 Keswick et al.
5,399,529 A 3/1995 Homma
5,403,434 A 4/1995 Moslehi
5,413,670 A 5/1995 Langan et al.
5,413,967 A 5/1995 Matsuda et al.
5,415,890 A 5/1995 Kloiber et al.
5,416,048 A 5/1995 Blalock et al.
5,420,075 A 5/1995 Homma et al.
5,429,995 A 7/1995 Nishiyama et al.
5,439,553 A 8/1995 Grant et al.
5,451,259 A 9/1995 Krogh
5,468,342 A 11/1995 Nulty et al.
5,474,589 A 12/1995 Ohga et al.
5,478,403 A 12/1995 Shinagawa et al.
5,478,462 A 12/1995 Walsh
5,483,920 A 1/1996 Pryor
5,500,249 A 3/1996 Telford et al.
5,505,816 A 4/1996 Barnes et al.
5,510,216 A 4/1996 Calabrese et al.
5,516,367 A 5/1996 Lei et al.
5,518,962 A 5/1996 Murao
5,531,835 A 7/1996 Fodor et al.
5,534,070 A 7/1996 Okamura et al.
5,536,360 A 7/1996 Nguyen et al.
5,549,780 A 8/1996 Koinuma et al.
5,558,717 A 9/1996 Zhao et al.
5,560,779 A 10/1996 Knowles et al.
5,563,105 A 10/1996 Dobuzinsky et al.
5,567,243 A 10/1996 Foster et al.
5,571,576 A 11/1996 Qian et al.
5,578,130 A 11/1996 Hayashi et al.
5,578,161 A 11/1996 Auda
5,580,421 A 12/1996 Hiatt et al.
5,591,269 A 1/1997 Arami et al.
5,599,740 A 2/1997 Jang et al.
5,616,518 A 4/1997 Foo et al.
5,624,582 A 4/1997 Cain
5,626,922 A 5/1997 Miyanaga et al.
5,628,829 A 5/1997 Foster et al.
5,635,086 A 6/1997 Warren, Jr.
5,645,645 A 7/1997 Zhang et al.
5,648,125 A 7/1997 Cane
5,648,175 A 7/1997 Russell et al.
5,656,093 A 8/1997 Burkhart et al.
5,661,093 A 8/1997 Ravi et al.
5,674,787 A 10/1997 Zhao et al.
5,676,758 A 10/1997 Hasegawa et al.
5,679,606 A 10/1997 Wang et al.
5,685,946 A 11/1997 Fathauer et al.
5,688,331 A 11/1997 Aruga et al.
5,695,810 A 12/1997 Dubin et al.
5,712,185 A 1/1998 Tsai et al.
5,716,500 A 2/1998 Bardos et al.
5,716,506 A 2/1998 Maclay et al.
5,719,085 A 2/1998 Moon et al.
5,733,816 A 3/1998 Iyer et al.
5,747,373 A 5/1998 Yu
5,755,859 A 5/1998 Brusic et al.
5,756,400 A 5/1998 Ye et al.
5,756,402 A 5/1998 Jimbo et al.
5,772,770 A 6/1998 Suda et al.
5,781,693 A 7/1998 Ballance et al.
5,786,276 A 7/1998 Brooks et al.
5,789,300 A 8/1998 Fulford
5,800,686 A 9/1998 Littau et al.
5,804,259 A 9/1998 Robles
5,812,403 A 9/1998 Fong et al.
5,814,365 A 9/1998 Mahawili
5,820,723 A 10/1998 Benjamin et al.
5,824,599 A 10/1998 Schacham-Diamand et al.
5,830,805 A 11/1998 Shacham-Diamand et al.
5,843,538 A 12/1998 Ehrsam et al.
5,843,847 A 12/1998 Pu et al.
5,844,195 A 12/1998 Fairbairn et al.
5,846,332 A 12/1998 Zhao et al.
5,846,375 A 12/1998 Gilchrist et al.
5,846,598 A 12/1998 Semkow et al.
5,849,639 A 12/1998 Molloy et al.
5,850,105 A 12/1998 Dawson et al.
5,855,681 A 1/1999 Maydan et al.
5,856,240 A 1/1999 Sinha et al.
5,858,876 A 1/1999 Chew
5,866,483 A 2/1999 Shiau et al.
5,872,052 A 2/1999 Iyer
5,872,058 A 2/1999 Van Cleemput et al.
5,882,424 A 3/1999 Taylor et al.
5,882,786 A 3/1999 Nassau et al.
5,885,404 A 3/1999 Kim et al.
5,885,749 A 3/1999 Huggins et al.
5,888,906 A 3/1999 Sandhu et al.
5,891,349 A 4/1999 Tobe et al.
5,891,513 A 4/1999 Dubin et al.
5,897,751 A 4/1999 Makowiecki et al.
5,899,752 A 5/1999 Hey et al.
5,904,827 A 5/1999 Reynolds
5,907,790 A 5/1999 Kellam
5,910,340 A 6/1999 Uchida et al.
5,913,147 A 6/1999 Dubin et al.
5,915,190 A 6/1999 Pirkle
5,918,116 A 6/1999 Chittipeddi

(56) References Cited

U.S. PATENT DOCUMENTS 5,920,792 A 7/1999 Lin
5,932,077 A 8/1999 Reynolds
5,933,757 A 8/1999 Yoshikawa et al.
5,935,334 A 8/1999 Fong et al.
5,937,323 A 8/1999 Orczyk et al.
5,939,831 A 8/1999 Fong et al.
5,942,075 A 8/1999 Nagahata et al.
5,944,902 A 8/1999 Redeker et al.
5,951,601 A 9/1999 Lesinski et al.
5,951,776 A 9/1999 Selyutin et al.
5,951,896 A 9/1999 Mahawili
5,953,591 A 9/1999 Ishihara et al.
5,953,635 A 9/1999 Andideh
5,968,610 A 10/1999 Liu et al.
5,969,422 A 10/1999 Ting et al.
5,976,327 A 11/1999 Tanaka
5,990,000 A 11/1999 Hong et al.
5,990,013 A 11/1999 Berenguer et al.
5,993,916 A 11/1999 Zhao et al.
6,004,884 A 12/1999 Abraham
6,007,635 A 12/1999 Mahawili
6,010,962 A 1/2000 Liu et al.
6,013,191 A 1/2000 Nasser-Faili et al.
6,013,584 A 1/2000 M'Saad
6,015,724 A 1/2000 Yamazaki et al.
6,015,747 A 1/2000 Lopatin et al.
6,020,271 A 2/2000 Yanagida
6,030,666 A 2/2000 Lam et al.
6,030,881 A 2/2000 Papasouliotis et al.
6,035,101 A 3/2000 Sajoto et al.
6,037,018 A 3/2000 Jang et al.
6,037,266 A 3/2000 Tao et al.
6,039,851 A 3/2000 Iyer
6,053,982 A 4/2000 Halpin et al.
6,059,643 A 5/2000 Hu et al.
6,063,683 A 5/2000 Wu et al.
6,063,712 A 5/2000 Gilton et al.
6,065,424 A 5/2000 Shacham-Diamand et al.
6,072,147 A 6/2000 Koshiishi
6,072,227 A 6/2000 Yau et al.
6,077,780 A 6/2000 Dubin
6,080,529 A 6/2000 Ye et al.
6,083,344 A 7/2000 Hanawa et al.
6,083,844 A 7/2000 Bui-Le et al.
6,086,677 A 7/2000 Umotoy et al.
6,087,278 A 7/2000 Kim et al.
6,090,212 A 7/2000 Mahawili
6,093,594 A 7/2000 Yeap et al.
6,099,697 A 8/2000 Hausmann
6,107,199 A 8/2000 Allen et al.
6,110,530 A 8/2000 Chen et al.
6,110,836 A 8/2000 Cohen et al.
6,110,838 A 8/2000 Loewenstein
6,113,771 A 9/2000 Landau et al.
6,117,245 A 9/2000 Mandrekar et al.
6,120,640 A * 9/2000 Shih ...................... C23C 28/044
118/719
6,136,163 A 10/2000 Cheung et al.
6,136,685 A 10/2000 Narwankar et al.
6,136,693 A 10/2000 Chan et al.
6,140,234 A 10/2000 Uzoh et al.
6,144,099 A 11/2000 Lopatin et al.
6,147,009 A 11/2000 Grill et al.
6,149,828 A 11/2000 Vaartstra
6,150,628 A 11/2000 Smith et al.
6,153,935 A 11/2000 Edelstein et al.
6,165,912 A 12/2000 McConnell et al.
6,167,834 B1 1/2001 Wang et al.
6,169,021 B1 1/2001 Akram et al.
6,170,428 B1 1/2001 Redeker et al.
6,171,661 B1 1/2001 Zheng et al.
6,174,450 B1 1/2001 Patrick et al.
6,174,812 B1 1/2001 Hsiung et al.
6,176,198 B1 1/2001 Kao et al.
6,177,245 B1 1/2001 Ward et al.
6,179,924 B1 1/2001 Zhao et al.
6,180,523 B1 1/2001 Lee et al.
6,182,602 B1 2/2001 Redeker et al.
6,184,121 B1 2/2001 Buchwalter et al.
6,189,483 B1 2/2001 Ishikawa et al.
6,190,233 B1 2/2001 Hong et al.
6,194,038 B1 2/2001 Rossman
6,197,181 B1 3/2001 Chen
6,197,364 B1 3/2001 Paunovic et al.
6,197,680 B1 3/2001 Lin et al.
6,197,688 B1 3/2001 Simpson
6,197,705 B1 3/2001 Vassiliev
6,203,863 B1 3/2001 Liu et al.
6,204,200 B1 3/2001 Shieh et al.
6,217,658 B1 4/2001 Orczyk et al.
6,228,233 B1 5/2001 Lakshmikanthan et al.
6,228,751 B1 5/2001 Yamazaki et al.
6,228,758 B1 5/2001 Pellerin et al.
6,235,643 B1 5/2001 Mui et al.
6,237,527 B1 5/2001 Kellerman et al.
6,238,513 B1 5/2001 Arnold et al.
6,238,582 B1 5/2001 Williams et al.
6,241,845 B1 6/2001 Gadgil et al.
6,242,349 B1 6/2001 Nogami et al.
6,245,396 B1 6/2001 Nogami
6,245,670 B1 6/2001 Cheung et al.
6,251,236 B1 6/2001 Stevens
6,251,802 B1 6/2001 Moore et al.
6,258,220 B1 7/2001 Dordi et al.
6,258,223 B1 7/2001 Cheung et al.
6,258,270 B1 7/2001 Hilgendorff et al.
6,261,637 B1 7/2001 Oberle
6,277,733 B1 8/2001 Smith
6,277,752 B1 8/2001 Chen
6,277,763 B1 8/2001 Kugimiya et al.
6,281,072 B1 8/2001 Li et al.
6,281,135 B1 8/2001 Han et al.
6,291,282 B1 9/2001 Wilk et al.
6,291,348 B1 9/2001 Lopatin et al.
6,303,418 B1 10/2001 Cha et al.
6,312,554 B1 11/2001 Ye
6,312,995 B1 11/2001 Yu
6,319,387 B1 11/2001 Krishnamoorthy et al.
6,322,716 B1 11/2001 Qiao et al.
6,323,128 B1 11/2001 Sambucetti et al.
6,335,288 B1 1/2002 Kwan et al.
6,340,435 B1 1/2002 Bjorkman et al.
6,342,733 B1 1/2002 Hu et al.
RE37,546 E 2/2002 Mahawili
6,344,410 B1 2/2002 Lopatin et al.
6,350,320 B1 2/2002 Sherstinsky et al.
6,350,697 B1 2/2002 Richardson
6,351,013 B1 2/2002 Luning et al.
6,352,081 B1 3/2002 Lu et al.
6,355,573 B1 3/2002 Okumura
6,364,949 B1 4/2002 Or et al.
6,364,954 B2 4/2002 Umotoy et al.
6,364,957 B1 4/2002 Schneider et al.
6,375,748 B1 4/2002 Yudovsky et al.
6,379,575 B1 4/2002 Yin et al.
6,383,951 B1 5/2002 Li
6,387,207 B1 5/2002 Janakiraman et al.
6,391,753 B1 5/2002 Yu
6,395,150 B1 5/2002 Van Cleemput et al.
6,403,491 B1 6/2002 Liu et al.
6,415,736 B1 7/2002 Hao et al.
6,416,647 B1 7/2002 Dordi et al.
6,427,623 B2 8/2002 Ko
6,432,819 B1 8/2002 Pavate et al.
6,432,831 B2 8/2002 Dhindsa et al.
6,436,193 B1 8/2002 Kasai et al.
6,436,816 B1 8/2002 Lee et al.
6,440,863 B1 8/2002 Tsai et al.
6,441,492 B1 8/2002 Cunningham
6,446,572 B1 9/2002 Brcka
6,448,537 B1 9/2002 Nering
6,458,718 B1 10/2002 Todd
6,461,974 B1 10/2002 Ni et al.
6,462,371 B1 10/2002 Weimer et al.

(56) References Cited

U.S. PATENT DOCUMENTS 6,465,366 B1 10/2002 Nemani et al.
6,477,980 B1 11/2002 White et al.
6,479,373 B2 11/2002 Dreybrodt et al.
6,488,984 B1 12/2002 Wada et al.
6,494,959 B1 12/2002 Carlson et al.
6,499,425 B1 12/2002 Sandhu et al.
6,500,728 B1 12/2002 Wang
6,503,843 B1 1/2003 Xia et al.
6,506,291 B2 1/2003 Tsai et al.
6,509,623 B2 1/2003 Zhao
6,516,815 B1 2/2003 Stevens et al.
6,518,548 B2 2/2003 Sugaya et al.
6,527,968 B1 3/2003 Wang et al.
6,528,409 B1 3/2003 Lopatin et al.
6,537,733 B2 3/2003 Campana et al.
6,541,397 B1 4/2003 Bencher
6,541,671 B1 4/2003 Martinez et al.
6,544,340 B2 4/2003 Yudovsky
6,547,977 B1 4/2003 Yan et al.
6,551,924 B1 4/2003 Dalton et al.
6,565,729 B2 5/2003 Chen et al.
6,569,773 B1 5/2003 Gellrich et al.
6,573,030 B1 6/2003 Fairbairn et al.
6,573,606 B2 6/2003 Sambucetti et al.
6,586,163 B1 7/2003 Okabe et al.
6,596,599 B1 7/2003 Guo
6,596,654 B1 7/2003 Bayman et al.
6,602,434 B1 8/2003 Hung et al.
6,603,269 B1 8/2003 Vo et al.
6,605,874 B2 8/2003 Leu et al.
6,616,967 B1 9/2003 Test
6,627,532 B1 9/2003 Gaillard et al.
6,635,578 B1 10/2003 Xu et al.
6,638,810 B2 10/2003 Bakli et al.
6,645,301 B2 11/2003 Sainty et al.
6,645,550 B1 11/2003 Cheung et al.
6,656,831 B1 12/2003 Lee et al.
6,656,837 B2 12/2003 Xu et al.
6,663,715 B1 12/2003 Yuda et al.
6,677,242 B1 1/2004 Liu et al.
6,679,981 B1 1/2004 Pan et al.
6,713,356 B1 3/2004 Skotnicki et al.
6,713,835 B1 3/2004 Horak et al.
6,717,189 B2 4/2004 Inoue et al.
6,720,213 B1 4/2004 Gambino et al.
6,740,585 B2 5/2004 Yoon et al.
6,740,977 B2 5/2004 Ahn et al.
6,743,473 B1 6/2004 Parkhe et al.
6,743,732 B1 6/2004 Lin et al.
6,756,235 B1 6/2004 Liu et al.
6,759,261 B2 7/2004 Shimokohbe et al.
6,762,127 B2 7/2004 Boiteux et al.
6,762,435 B2 7/2004 Nemani et al.
6,764,958 B1 7/2004 Sugiarto et al.
6,765,273 B1 7/2004 Chau et al.
6,767,834 B2 7/2004 Chung et al.
6,772,827 B2 8/2004 Keller et al.
6,794,290 B1 9/2004 Papasouliotis et al.
6,794,311 B2 9/2004 Huang et al.
6,796,314 B1 9/2004 Graff et al.
6,797,189 B2 9/2004 Hung et al.
6,800,830 B2 10/2004 Mahawili
6,802,944 B2 10/2004 Ahmad et al.
6,808,564 B2 10/2004 Dietze
6,808,748 B2 10/2004 Kapoor et al.
6,821,571 B2 11/2004 Huang
6,823,589 B2 11/2004 White et al.
6,830,624 B2 12/2004 Janakiraman et al.
6,835,995 B2 12/2004 Li
6,846,745 B1 1/2005 Papasouliotis et al.
6,852,550 B2 2/2005 Tuttle et al.
6,858,153 B2 2/2005 Bjorkman et al.
6,861,097 B1 3/2005 Goosey et al.
6,861,332 B2 3/2005 Park et al.
6,869,880 B2 3/2005 Krishnaraj et al.
6,875,280 B2 4/2005 Ikeda et al.
6,878,206 B2 4/2005 Tzu et al.
6,879,981 B2 4/2005 Rothschild et al.
6,886,491 B2 5/2005 Kim et al.
6,892,669 B2 5/2005 Xu et al.
6,893,967 B1 5/2005 Wright et al.
6,897,532 B1 5/2005 Schwarz et al.
6,903,511 B2 6/2005 Chistyakov
6,908,862 B2 6/2005 Li et al.
6,911,112 B2 6/2005 An
6,911,401 B2 6/2005 Khandan et al.
6,921,556 B2 7/2005 Shimizu et al.
6,924,191 B2 8/2005 Liu et al.
6,930,047 B2 8/2005 Yamazaki
6,942,753 B2 9/2005 Choi et al.
6,946,033 B2 9/2005 Tsuei et al.
6,951,821 B2 10/2005 Hamelin et al.
6,958,175 B2 10/2005 Sakamoto et al.
6,958,286 B2 10/2005 Chen et al.
6,995,073 B2 2/2006 Liou
7,017,269 B2 3/2006 White et al.
7,018,941 B2 3/2006 Cui et al.
7,030,034 B2 4/2006 Fucsko et al.
7,049,200 B2 5/2006 Arghavani et al.
7,071,532 B2 7/2006 Geffken et al.
7,084,070 B1 8/2006 Lee et al.
7,115,525 B2 10/2006 Abatchev et al.
7,122,949 B2 10/2006 Strikovski
7,145,725 B2 12/2006 Hasei et al.
7,148,155 B1 12/2006 Tarafdar et al.
7,166,233 B2 1/2007 Johnson et al.
7,183,214 B2 2/2007 Nam et al.
7,196,342 B2 3/2007 Ershov et al.
7,226,805 B2 6/2007 Hallin et al.
7,235,137 B2 6/2007 Kitayama et al.
7,252,716 B2 8/2007 Kim et al.
7,253,123 B2 8/2007 Arghavani et al.
7,256,370 B2 8/2007 Guiver
7,288,482 B2 10/2007 Panda et al.
7,341,633 B2 3/2008 Lubomirsky et al.
7,365,016 B2 4/2008 Ouellet et al.
7,396,480 B2 7/2008 Kao et al.
7,416,989 B1 8/2008 Liu et al.
7,465,358 B2 12/2008 Weidman et al.
7,468,319 B2 12/2008 Lee
7,484,473 B2 2/2009 Keller et al.
7,488,688 B2 2/2009 Chung et al.
7,494,545 B2 2/2009 Lam et al.
7,553,756 B2 6/2009 Hayashi et al.
7,575,007 B2 8/2009 Tang et al.
7,581,511 B2 9/2009 Mardian et al.
7,604,708 B2 10/2009 Wood et al.
7,628,897 B2 12/2009 Mungekar et al.
7,682,518 B2 3/2010 Chandrachood et al.
7,708,859 B2 5/2010 Huang et al.
7,722,925 B2 5/2010 White et al.
7,723,221 B2 5/2010 Hayashi
7,749,326 B2 7/2010 Kim et al.
7,785,672 B2 8/2010 Choi et al.
7,806,078 B2 10/2010 Yoshida
7,807,578 B2 10/2010 Bencher et al.
7,837,828 B2 11/2010 Ikeda et al.
7,915,139 B1 3/2011 Lang et al.
7,932,181 B2 4/2011 Singh et al.
7,939,422 B2 5/2011 Ingle et al.
7,968,441 B2 6/2011 Xu
7,976,631 B2 7/2011 Burrows
7,981,806 B2 7/2011 Jung
8,008,166 B2 8/2011 Sanchez et al.
8,058,179 B1 11/2011 Draeger et al.
8,071,482 B2 12/2011 Kawada
8,074,599 B2 12/2011 Choi et al.
8,076,198 B2 12/2011 Lee et al.
8,083,853 B2 12/2011 Choi et al.
8,119,530 B2 2/2012 Hori et al.
8,133,349 B1 3/2012 Panagopoulos
8,187,486 B1 5/2012 Liu et al.
8,211,808 B2 7/2012 Sapre et al.
8,298,627 B2 10/2012 Minami et al.

(56) References Cited

U.S. PATENT DOCUMENTS 8,309,440 B2 11/2012 Sanchez et al.
8,313,610 B2 11/2012 Dhindsa
8,328,939 B2 12/2012 Choi et al.
8,368,308 B2 2/2013 Banna et al.
8,435,902 B2 5/2013 Tang et al.
8,475,674 B2 7/2013 Thadani et al.
8,491,805 B2 7/2013 Kushibiki et al.
8,501,629 B2 8/2013 Tang et al.
8,506,713 B2 8/2013 Takagi
8,512,509 B2 8/2013 Bera et al.
8,623,148 B2 1/2014 Mitchell et al.
8,623,471 B2 1/2014 Tyler et al.
8,642,481 B2 2/2014 Wang et al.
8,679,982 B2 3/2014 Wang et al.
8,679,983 B2 3/2014 Wang et al.
8,741,778 B2 6/2014 Yang et al.
8,747,680 B1 6/2014 Deshpande
8,765,574 B2 7/2014 Zhang et al.
8,771,536 B2 7/2014 Zhang et al.
8,771,539 B2 7/2014 Zhang et al.
8,772,888 B2 7/2014 Jung et al.
8,778,079 B2 7/2014 Begarney et al.
8,801,952 B1 8/2014 Wang et al.
8,808,563 B2 8/2014 Wang et al.
8,846,163 B2 9/2014 Kao et al.
8,895,449 B1 11/2014 Zhu et al.
8,900,364 B2 12/2014 Wright
8,921,234 B2 12/2014 Liu et al.
8,927,390 B2 1/2015 Sapre et al.
8,951,429 B1 2/2015 Liu et al.
8,956,980 B1 2/2015 Chen et al.
8,969,212 B2 3/2015 Ren et al.
8,980,005 B2 3/2015 Carlson et al.
8,980,758 B1 3/2015 Ling et al.
8,980,763 B2 3/2015 Wang et al.
8,992,733 B2 3/2015 Uehara et al.
8,999,839 B2 4/2015 Su et al.
8,999,856 B2 4/2015 Zhang et al.
9,012,302 B2 4/2015 Sapre et al.
9,017,481 B1 4/2015 Pettinger et al.
9,023,732 B2 5/2015 Wang et al.
9,023,734 B2 5/2015 Chen et al.
9,034,770 B2 5/2015 Park et al.
9,040,422 B2 5/2015 Wang et al.
9,064,815 B2 6/2015 Zhang et al.
9,064,816 B2 6/2015 Kim et al.
9,072,158 B2 6/2015 Ikeda et al.
9,093,371 B2 7/2015 Wang et al.
9,093,390 B2 7/2015 Wang et al.
9,111,877 B2 8/2015 Chen et al.
9,114,438 B2 8/2015 Hoinkis et al.
9,117,855 B2 8/2015 Cho et al.
2001/0008803 A1 7/2001 Takamatsu et al.
2001/0015261 A1 8/2001 Kobayashi et al.
2001/0028093 A1 10/2001 Yamazaki et al.
2001/0028922 A1 10/2001 Sandhu
2001/0030366 A1 10/2001 Nakano et al.
2001/0034106 A1* 10/2001 Moise ............... H01L 21/31122 438/396
2001/0034121 A1 10/2001 Fu et al.
2001/0036706 A1 11/2001 Kitamura
2001/0041444 A1 11/2001 Shields et al.
2001/0047760 A1 12/2001 Moslehi
2001/0053585 A1 12/2001 Kikuchi et al.
2001/0054381 A1 12/2001 Umotoy et al.
2001/0055842 A1 12/2001 Uh et al.
2002/0000202 A1 1/2002 Yuda et al.
2002/0011210 A1 1/2002 Satoh et al.
2002/0016080 A1 2/2002 Khan et al.
2002/0016085 A1 2/2002 Huang et al.
2002/0028582 A1 3/2002 Nallan et al.
2002/0028585 A1 3/2002 Chung et al.
2002/0029747 A1 3/2002 Powell et al.
2002/0033233 A1 3/2002 Savas
2002/0036143 A1 3/2002 Segawa et al.
2002/0040764 A1 4/2002 Kwan et al.
2002/0045966 A1 4/2002 Lee et al.
2002/0054962 A1 5/2002 Huang
2002/0069820 A1 6/2002 Yudovsky
2002/0070414 A1 6/2002 Drescher et al.
2002/0074573 A1 6/2002 Takeuchi et al.
2002/0090781 A1 7/2002 Skotnicki et al.
2002/0098681 A1 7/2002 Hu et al.
2002/0124867 A1 9/2002 Kim et al.
2002/0129769 A1 9/2002 Kim et al.
2002/0153808 A1 10/2002 Skotnicki et al.
2002/0164885 A1 11/2002 Lill et al.
2002/0177322 A1 11/2002 Li et al.
2002/0187280 A1 12/2002 Johnson et al.
2002/0187655 A1 12/2002 Tan et al.
2003/0003757 A1 1/2003 Nallan et al.
2003/0010645 A1 1/2003 Ting et al.
2003/0019428 A1 1/2003 Ku et al.
2003/0019580 A1 1/2003 Strang
2003/0029566 A1 2/2003 Roth
2003/0029715 A1 2/2003 Yu et al.
2003/0032284 A1 2/2003 Enomoto et al.
2003/0038127 A1 2/2003 Liu et al.
2003/0038305 A1 2/2003 Wasshuber
2003/0054608 A1 3/2003 Tseng et al.
2003/0072639 A1 4/2003 White et al.
2003/0075808 A1 4/2003 Inoue et al.
2003/0077909 A1 4/2003 Jiwari
2003/0079686 A1 5/2003 Chen et al.
2003/0087531 A1 5/2003 Kang et al.
2003/0091938 A1 5/2003 Fairbairn et al.
2003/0098125 A1 5/2003 An
2003/0109143 A1 6/2003 Hsieh et al.
2003/0116087 A1 6/2003 Nguyen et al.
2003/0116439 A1 6/2003 Seo et al.
2003/0121608 A1 7/2003 Chen et al.
2003/0124465 A1 7/2003 Lee et al.
2003/0124842 A1 7/2003 Hytros et al.
2003/0127740 A1 7/2003 Hsu et al.
2003/0129106 A1 7/2003 Sorensen et al.
2003/0129827 A1 7/2003 Lee et al.
2003/0132319 A1 7/2003 Hytros et al.
2003/0140844 A1 7/2003 Maa et al.
2003/0148035 A1 8/2003 Lingampalli
2003/0159307 A1 8/2003 Sago et al.
2003/0173333 A1 9/2003 Wang et al.
2003/0173347 A1 9/2003 Guiver
2003/0181040 A1 9/2003 Ivanov et al.
2003/0183244 A1 10/2003 Rossman
2003/0190426 A1 10/2003 Padhi et al.
2003/0199170 A1 10/2003 Li
2003/0205329 A1 11/2003 Gujer et al.
2003/0215963 A1 11/2003 AmRhein et al.
2003/0221780 A1 12/2003 Lei et al.
2003/0224217 A1 12/2003 Byun et al.
2003/0224617 A1 12/2003 Baek et al.
2004/0005726 A1 1/2004 Huang
2004/0020601 A1 2/2004 Zhao et al.
2004/0026371 A1 2/2004 Nguyen et al.
2004/0033678 A1 2/2004 Arghavani et al.
2004/0050328 A1 3/2004 Kumagai et al.
2004/0058293 A1 3/2004 Nguyen et al.
2004/0069225 A1 4/2004 Fairbairn et al.
2004/0070346 A1 4/2004 Choi
2004/0072446 A1 4/2004 Liu et al.
2004/0099378 A1 5/2004 Kim et al.
2004/0101667 A1 5/2004 O'Loughlin et al.
2004/0115876 A1 6/2004 Goundar et al.
2004/0129671 A1* 7/2004 Ji ............................. B08B 7/00 216/58
2004/0137161 A1 7/2004 Segawa et al.
2004/0144490 A1 7/2004 Zhao et al.
2004/0154535 A1 8/2004 Chen et al.
2004/0175929 A1 9/2004 Schmitt et al.
2004/0182315 A1 9/2004 Laflamme et al.
2004/0192032 A1 9/2004 Ohmori et al.
2004/0194799 A1 10/2004 Kim et al.
2004/0211357 A1 10/2004 Gadgil et al.
2004/0219789 A1 11/2004 Wood et al.

(56) References Cited

U.S. PATENT DOCUMENTS

2005/0001276 A1 1/2005 Gao et al.
2005/0003676 A1 1/2005 Ho et al.
2005/0009340 A1 1/2005 Saijo et al.
2005/0009358 A1 1/2005 Choi et al.
2005/0026430 A1 2/2005 Kim et al.
2005/0026431 A1 2/2005 Kazumi et al.
2005/0035455 A1 2/2005 Hu et al.
2005/0073051 A1 4/2005 Yamamoto et al.
2005/0090120 A1 4/2005 Hasegawa et al.
2005/0098111 A1 5/2005 Shimizu et al.
2005/0112901 A1 5/2005 Ji et al.
2005/0181588 A1 8/2005 Kim
2005/0199489 A1 9/2005 Stevens et al.
2005/0205110 A1 9/2005 Kao et al.
2005/0205862 A1 9/2005 Koemtzopoulos et al.
2005/0208215 A1 9/2005 Eguchi et al.
2005/0214477 A1 9/2005 Hanawa et al.
2005/0218507 A1 10/2005 Kao et al.
2005/0221552 A1 10/2005 Kao et al.
2005/0230350 A1 10/2005 Kao et al.
2005/0236694 A1 10/2005 Wu et al.
2005/0251990 A1 11/2005 Choi et al.
2005/0266622 A1 12/2005 Arghavani et al.
2005/0266691 A1 12/2005 Gu et al.
2005/0269030 A1 12/2005 Kent et al.
2005/0287771 A1 12/2005 Seamons et al.
2006/0000802 A1 1/2006 Kumar et al.
2006/0000805 A1 1/2006 Todorow et al.
2006/0006057 A1 1/2006 Laermer
2006/0011298 A1 1/2006 Lim et al.
2006/0019456 A1 1/2006 Bu et al.
2006/0019486 A1 1/2006 Yu et al.
2006/0021574 A1 2/2006 Armour et al.
2006/0024954 A1 2/2006 Wu et al.
2006/0024956 A1 2/2006 Zhijian et al.
2006/0033678 A1 2/2006 Lubomirsky et al.
2006/0040055 A1 2/2006 Nguyen et al.
2006/0043066 A1 3/2006 Kamp
2006/0046412 A1 3/2006 Nguyen et al.
2006/0046419 A1 3/2006 Sandhu et al.
2006/0051966 A1 3/2006 Or et al.
2006/0051968 A1 3/2006 Joshi et al.
2006/0054184 A1 3/2006 Mozetic et al.
2006/0060942 A1 3/2006 Minixhofer et al.
2006/0093756 A1 5/2006 Rajagopalan et al.
2006/0097397 A1 5/2006 Russell et al.
2006/0102076 A1 5/2006 Smith et al.
2006/0121724 A1 6/2006 Yue et al.
2006/0124242 A1 6/2006 Kanarik et al.
2006/0130971 A1 6/2006 Chang et al.
2006/0157449 A1 7/2006 Takahashi et al.
2006/0162661 A1 7/2006 Jung et al.
2006/0166107 A1 7/2006 Chen et al.
2006/0166515 A1 7/2006 Karim et al.
2006/0178008 A1 8/2006 Yeh et al.
2006/0185592 A1 8/2006 Matsuura
2006/0191637 A1 8/2006 Zajac et al.
2006/0207504 A1 9/2006 Hasebe et al.
2006/0210723 A1 9/2006 Ishizaka
2006/0216878 A1 9/2006 Lee
2006/0222481 A1 10/2006 Foree
2006/0226121 A1 10/2006 Aoi
2006/0228889 A1 10/2006 Edelberg et al.
2006/0240661 A1 10/2006 Annapragada et al.
2006/0246217 A1 11/2006 Weidman et al.
2006/0251800 A1 11/2006 Weidman et al.
2006/0251801 A1 11/2006 Weidman et al.
2006/0252252 A1 11/2006 Zhu et al.
2006/0252265 A1* 11/2006 Jin .................... H01L 21/31116 438/689
2006/0260750 A1 11/2006 Rueger
2006/0261490 A1 11/2006 Su et al.
2006/0264043 A1 11/2006 Stewart et al.
2006/0266288 A1 11/2006 Choi
2007/0048977 A1 3/2007 Lee et al.
2007/0071888 A1 3/2007 Shanmugasundram et al.
2007/0072408 A1 3/2007 Enomoto et al.
2007/0090325 A1 4/2007 Hwang et al.
2007/0099428 A1 5/2007 Shamiryan et al.
2007/0099438 A1 5/2007 Ye et al.
2007/0107750 A1 5/2007 Sawin et al.
2007/0108404 A1 5/2007 Stewart et al.
2007/0111519 A1 5/2007 Lubomirsky et al.
2007/0117396 A1 5/2007 Wu et al.
2007/0119370 A1 5/2007 Ma et al.
2007/0119371 A1 5/2007 Ma et al.
2007/0123051 A1 5/2007 Arghavani et al.
2007/0131274 A1 6/2007 Stollwerck et al.
2007/0163440 A1 7/2007 Kim et al.
2007/0181057 A1 8/2007 Lam et al.
2007/0193515 A1 8/2007 Jeon et al.
2007/0197028 A1 8/2007 Byun et al.
2007/0235134 A1 10/2007 Iimuro
2007/0238321 A1 10/2007 Futase et al.
2007/0243685 A1 10/2007 Jiang et al.
2007/0266946 A1 11/2007 Choi
2007/0281106 A1 12/2007 Lubomirsky et al.
2008/0044990 A1 2/2008 Lee
2008/0075668 A1 3/2008 Goldstein
2008/0081483 A1 4/2008 Wu
2008/0085604 A1 4/2008 Hoshino et al.
2008/0099147 A1 5/2008 Myo et al.
2008/0099431 A1 5/2008 Kumar et al.
2008/0099876 A1 5/2008 Seto
2008/0102640 A1* 5/2008 Hassan ............. H01L 21/67069 438/704
2008/0115726 A1 5/2008 Ingle et al.
2008/0121970 A1 5/2008 Aritome
2008/0124937 A1 5/2008 Xu et al.
2008/0142831 A1 6/2008 Su
2008/0153306 A1 6/2008 Cho et al.
2008/0156771 A1 7/2008 Jeon et al.
2008/0160210 A1 7/2008 Yang et al.
2008/0171407 A1 7/2008 Nakabayashi et al.
2008/0182381 A1 7/2008 Kiyotoshi
2008/0182383 A1 7/2008 Lee et al.
2008/0202892 A1 8/2008 Smith et al.
2008/0230519 A1 9/2008 Takahashi
2008/0233709 A1 9/2008 Conti et al.
2008/0254635 A1 10/2008 Benzel et al.
2008/0261404 A1 10/2008 Kozuka et al.
2008/0268645 A1 10/2008 Kao et al.
2008/0292798 A1 11/2008 Huh et al.
2008/0293248 A1 11/2008 Park et al.
2009/0001480 A1 1/2009 Cheng
2009/0004849 A1 1/2009 Eun
2009/0017227 A1 1/2009 Fu et al.
2009/0045167 A1 2/2009 Maruyama
2009/0072401 A1 3/2009 Arnold et al.
2009/0081878 A1 3/2009 Dhindsa
2009/0084317 A1 4/2009 Wu et al.
2009/0095621 A1 4/2009 Kao et al.
2009/0104738 A1 4/2009 Ring et al.
2009/0104782 A1 4/2009 Lu et al.
2009/0111280 A1 4/2009 Kao et al.
2009/0170221 A1 7/2009 Jacques et al.
2009/0179300 A1 7/2009 Arai
2009/0189246 A1 7/2009 Wu et al.
2009/0194810 A1 8/2009 Kiyotoshi et al.
2009/0197418 A1 8/2009 Sago et al.
2009/0202721 A1 8/2009 Nogami et al.
2009/0255902 A1 10/2009 Satoh et al.
2009/0258162 A1 10/2009 Furuta et al.
2009/0269934 A1 10/2009 Kao et al.
2009/0275146 A1 11/2009 Takano et al.
2009/0275205 A1 11/2009 Kiehlbauch et al.
2009/0275206 A1 11/2009 Katz et al.
2009/0277874 A1 11/2009 Rui et al.
2009/0280650 A1 11/2009 Lubomirsky et al.
2009/0286400 A1 11/2009 Heo et al.
2009/0294898 A1 12/2009 Feustel et al.
2010/0003824 A1 1/2010 Kadkhodayan et al.
2010/0048027 A1 2/2010 Cheng et al.
2010/0055408 A1 3/2010 Lee et al.

(56) References Cited

U.S. PATENT DOCUMENTS

2010/0055917 A1 3/2010 Kim
2010/0059889 A1 3/2010 Gosset et al.
2010/0062603 A1 3/2010 Ganguly et al.
2010/0093151 A1 4/2010 Arghavani et al.
2010/0099236 A1 4/2010 Kwon et al.
2010/0099263 A1 4/2010 Kao et al.
2010/0101727 A1 4/2010 Ji
2010/0105209 A1 4/2010 Winniczek et al.
2010/0130001 A1 5/2010 Noguchi
2010/0144140 A1 6/2010 Chandrashekar et al.
2010/0164422 A1 7/2010 Shu et al.
2010/0173499 A1 7/2010 Tao et al.
2010/0178755 A1 7/2010 Lee et al.
2010/0180819 A1 7/2010 Hatanaka et al.
2010/0187534 A1 7/2010 Nishi et al.
2010/0187588 A1 7/2010 Gil-sub et al.
2010/0187694 A1 7/2010 Yu et al.
2010/0190352 A1 7/2010 Jaiswal
2010/0203739 A1 8/2010 Becker et al.
2010/0207205 A1 8/2010 Grebs et al.
2010/0294199 A1 11/2010 Tran et al.
2010/0330814 A1 12/2010 Yokota et al.
2011/0008950 A1 1/2011 Xu
2011/0011338 A1 1/2011 Chuc et al.
2011/0034035 A1 2/2011 Liang et al.
2011/0045676 A1 2/2011 Park
2011/0053380 A1 3/2011 Sapre et al.
2011/0061810 A1 3/2011 Ganguly et al.
2011/0081782 A1 4/2011 Liang et al.
2011/0100489 A1 5/2011 Orito
2011/0111596 A1 5/2011 Kanakasabapathy
2011/0124144 A1 5/2011 Schlemm et al.
2011/0143542 A1 6/2011 Feurprier et al.
2011/0151674 A1 6/2011 Tang et al.
2011/0151677 A1 6/2011 Wang et al.
2011/0151678 A1 6/2011 Ashtiani et al.
2011/0155181 A1 6/2011 Inatomi
2011/0159690 A1 6/2011 Chandrashekar et al.
2011/0165771 A1 7/2011 Ring et al.
2011/0180847 A1 7/2011 Ikeda et al.
2011/0195575 A1 8/2011 Wang
2011/0217851 A1 9/2011 Liang et al.
2011/0226734 A1 9/2011 Sumiya et al.
2011/0230052 A1 9/2011 Tang et al.
2011/0232737 A1 9/2011 Ruletzki et al.
2011/0266252 A1 11/2011 Thadani et al.
2011/0266682 A1 11/2011 Edelstein et al.
2011/0294300 A1 12/2011 Zhang et al.
2011/0298061 A1 12/2011 Siddiqui et al.
2012/0003782 A1 1/2012 Byun et al.
2012/0009796 A1 1/2012 Cui et al.
2012/0025289 A1 2/2012 Liang et al.
2012/0031559 A1 2/2012 Dhindsa et al.
2012/0068242 A1 3/2012 Shin et al.
2012/0129354 A1 5/2012 Luong
2012/0135576 A1 5/2012 Lee et al.
2012/0161405 A1 6/2012 Mohn et al.
2012/0164839 A1 6/2012 Nishimura
2012/0180954 A1 7/2012 Yang et al.
2012/0196447 A1 8/2012 Yang et al.
2012/0211462 A1 8/2012 Zhang et al.
2012/0223048 A1 9/2012 Paranjpe et al.
2012/0225557 A1 9/2012 Serry et al.
2012/0238102 A1 9/2012 Zhang et al.
2012/0238103 A1 9/2012 Zhang et al.
2012/0267346 A1 10/2012 Kao et al.
2012/0285621 A1 11/2012 Tan
2012/0292664 A1 11/2012 Kanike
2012/0309204 A1 12/2012 Kang et al.
2013/0005103 A1 1/2013 Liu et al.
2013/0005140 A1 1/2013 Jeng et al.
2013/0034968 A1 2/2013 Zhang et al.
2013/0045605 A1 2/2013 Wang et al.
2013/0052827 A1 2/2013 Wang et al.
2013/0052833 A1 2/2013 Ranjan et al.
2013/0059440 A1 3/2013 Wang et al.
2013/0065398 A1* 3/2013 Ohsawa ............ H01L 21/32136 438/714
2013/0082197 A1 4/2013 Yang et al.
2013/0089988 A1 4/2013 Wang et al.
2013/0119483 A1 5/2013 Alptekin et al.
2013/0130507 A1 5/2013 Wang et al.
2013/0187220 A1 7/2013 Surthi
2013/0224960 A1 8/2013 Payyapilly et al.
2013/0260533 A1 10/2013 Sapre et al.
2013/0260564 A1 10/2013 Sapre et al.
2013/0284369 A1 10/2013 Kobayashi et al.
2013/0284370 A1 10/2013 Kobayashi et al.
2013/0298942 A1 11/2013 Ren et al.
2013/0302980 A1 11/2013 Chandrashekar et al.
2014/0021673 A1 1/2014 Chen et al.
2014/0057447 A1 2/2014 Yang et al.
2014/0065842 A1 3/2014 Anthis et al.
2014/0080308 A1 3/2014 Chen et al.
2014/0080310 A1 3/2014 Chen et al.
2014/0083362 A1 3/2014 Lubomirsky et al.
2014/0087488 A1 3/2014 Nam et al.
2014/0097270 A1 4/2014 Liang et al.
2014/0099794 A1 4/2014 Ingle et al.
2014/0141621 A1 5/2014 Linnartz et al.
2014/0147126 A1 5/2014 Linnartz et al.
2014/0166618 A1 6/2014 Tadigadapa et al.
2014/0227881 A1 8/2014 Lubomirsky et al.
2014/0234466 A1 8/2014 Gao et al.
2014/0248780 A1 9/2014 Ingle et al.
2014/0256131 A1 9/2014 Wang et al.
2014/0262031 A1 9/2014 Belostotskiy et al.
2014/0262038 A1 9/2014 Wang et al.
2014/0263272 A1 9/2014 Duan et al.
2014/0271097 A1 9/2014 Wang et al.
2014/0273406 A1 9/2014 Wang et al.
2014/0273451 A1 9/2014 Wang et al.
2014/0273462 A1 9/2014 Simsek-Ege et al.
2014/0273489 A1 9/2014 Wang et al.
2014/0273491 A1 9/2014 Zhang et al.
2014/0273492 A1 9/2014 Anthis et al.
2014/0288528 A1 9/2014 Py et al.
2014/0302678 A1 10/2014 Paterson et al.
2014/0308758 A1 10/2014 Nemani et al.
2014/0308816 A1 10/2014 Wang et al.
2014/0311581 A1 10/2014 Belostotskiy et al.
2014/0342569 A1 11/2014 Zhu et al.
2014/0349477 A1 11/2014 Chandrashekar et al.
2015/0011096 A1 1/2015 Chandrasekharan et al.
2015/0014152 A1 1/2015 Hoinkis et al.
2015/0031211 A1 1/2015 Sapre et al.
2015/0060265 A1 3/2015 Cho et al.
2015/0079797 A1 3/2015 Chen et al.
2015/0126035 A1 5/2015 Diao et al.
2015/0126039 A1 5/2015 Korolik et al.
2015/0126040 A1 5/2015 Korolik et al.
2015/0129541 A1 5/2015 Wang et al.
2015/0129545 A1 5/2015 Ingle et al.
2015/0129546 A1 5/2015 Ingle et al.
2015/0132968 A1 5/2015 Ren et al.
2015/0155177 A1 6/2015 Zhang et al.
2015/0170879 A1 6/2015 Nguyen et al.
2015/0170920 A1 6/2015 Purayath et al.
2015/0170924 A1 6/2015 Nguyen et al.
2015/0170935 A1 6/2015 Wang et al.
2015/0170943 A1 6/2015 Nguyen et al.
2015/0179464 A1 6/2015 Wang et al.
2015/0206764 A1 7/2015 Wang et al.
2015/0214066 A1 7/2015 Luere et al.
2015/0214067 A1 7/2015 Zhang et al.
2015/0214092 A1 7/2015 Purayath et al.
2015/0214337 A1 7/2015 Ko et al.
2015/0221541 A1 8/2015 Nemani et al.
2015/0247231 A1 9/2015 Nguyen et al.
2015/0270140 A1* 9/2015 Gupta ............... H01L 21/31122 216/67

* cited by examiner

ALUMINUM OXIDE SELECTIVE ETCH

FIELD

This invention relates to selectively removing aluminum oxide.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective of the first material. As a result of the diversity of materials, circuits and processes, etch processes have been developed that selectively remove one or more of a broad range of materials.

Dry etch processes are often desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. For example, remote plasma excitation of ammonia and nitrogen trifluoride enables silicon oxide to be selectively removed from a patterned substrate when the plasma effluents are flowed into the substrate processing region. Remote plasma etch processes have recently been developed to selectively remove a variety of dielectrics relative to one another. However, relatively few dry-etch processes have been developed to selectively remove aluminum oxide with high selectivity.

SUMMARY

Methods of selectively etching aluminum oxide from the surface of a patterned substrate are described. The etch selectively removes aluminum oxide relative to other metal oxides and silicon-containing films such as silicon, polysilicon, silicon oxide, silicon germanium and/or silicon nitride. The methods include exposing aluminum oxide to plasma effluents formed in a remote plasma from a chlorine-containing precursor and a hydrocarbon. A remote plasma is used to excite the precursors and a local plasma is used to further excite the plasma effluents and accelerate ions toward the patterned substrate.

Embodiments of the invention include methods of etching aluminum oxide. The methods include placing a patterned substrate in a substrate processing region of a substrate processing chamber. The patterned substrate includes an exposed aluminum oxide portion. The methods further include flowing a chlorine-containing precursor into a remote plasma region fluidly coupled to the substrate processing region. The methods further include flowing a hydrogen-and-carbon-containing precursor into the remote plasma region. The methods further include forming a remote plasma in the remote plasma region from the chlorine-containing precursor and the hydrogen-and-carbon-containing precursor to produce plasma effluents. The methods further include flowing the plasma effluents into the substrate processing region through through-holes in a showerhead. The showerhead is disposed between the remote plasma region and the substrate processing chamber. The methods further include forming a bias plasma in the substrate processing region to further excite the plasma effluents. The methods further include etching the exposed aluminum oxide portion from the patterned substrate. A temperature of the patterned substrate is 130° C. or below during the operation of etching the exposed aluminum oxide portion.

Embodiments of the invention include methods of etching aluminum oxide. The methods include placing a patterned substrate in a substrate processing region of a substrate processing chamber. The patterned substrate includes an exposed aluminum oxide portion. The methods further include flowing radical-chlorine into the substrate processing region. The methods further include flowing radical-hydrogen-carbon into the substrate processing region. The methods further include forming a bias plasma in the substrate processing region to excite the radical-chlorine and the radical-hydrogen-carbon. The methods further include etching the exposed aluminum oxide portion from the patterned substrate. A temperature of the patterned substrate is below 130° C. during the operation of etching the exposed aluminum oxide portion.

Embodiments of the invention include methods of etching aluminum oxide. The methods include placing a patterned substrate in a substrate processing region of a substrate processing chamber. The patterned substrate includes an exposed aluminum oxide portion and a second exposed portion of silicon nitride, silicon or hafnium oxide. The methods further include combining molecular chlorine with methane in a remote plasma region fluidly coupled to the substrate processing region. The methods further include forming a remote plasma in the remote plasma region from the molecular chlorine and the methane to produce plasma effluents which flow into the substrate processing region through through-holes in a showerhead. The showerhead is disposed between the remote plasma region and the substrate processing chamber. The methods further include forming a bias plasma in the substrate processing region to further excite the plasma effluents. A pressure in the substrate processing region is between 0.01 Torr and 1.0 Torr during the operation of forming the bias plasma. The methods further include etching the exposed aluminum oxide portion from the patterned substrate. A temperature of the patterned substrate is below 130° C. during the operation of etching the aluminum oxide. The exposed aluminum oxide portion etches at greater than twenty times an etch rate of the second exposed portion.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Methods of selectively etching aluminum oxide from the surface of a patterned substrate are described. The etch selectively removes aluminum oxide relative to other metal oxides and silicon-containing films such as silicon, polysilicon, silicon oxide, silicon germanium and/or silicon nitride. The methods include exposing aluminum oxide to plasma effluents formed in a remote plasma from a chlorine-containing precursor and a hydrocarbon. A remote plasma is used to excite the precursors and a local plasma is used to further excite the plasma effluents and accelerate ions toward the patterned substrate. The selective etch process may remove aluminum oxide at significant etch rates even at room temperature and below.

Figure 1:
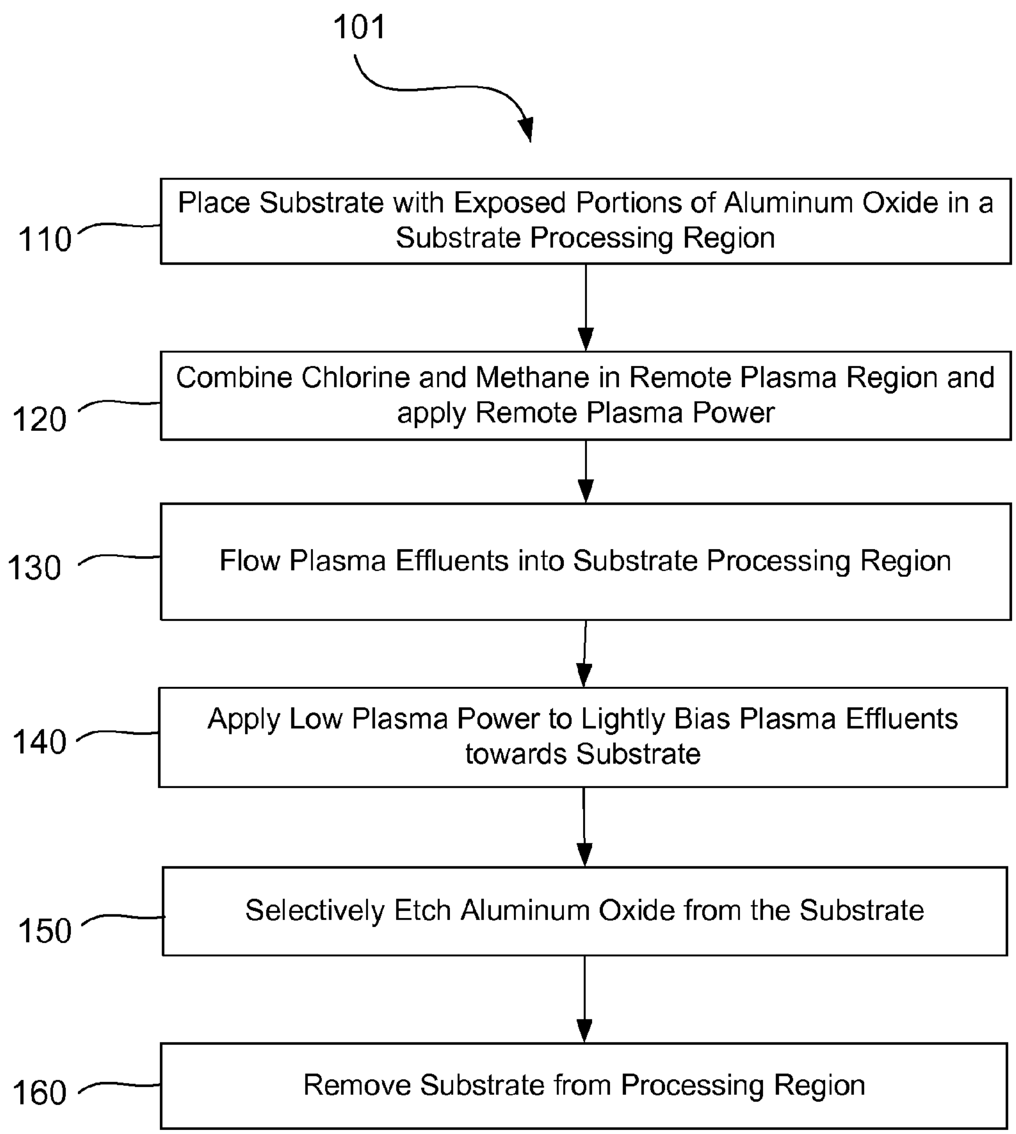
FIG. 1 is a flow chart of an aluminum oxide selective etch process according to embodiments.

In order to better understand and appreciate the invention, reference is now made to FIG. 1 which is a flow chart of an aluminum oxide selective etch process 101 according to embodiments. The aluminum oxide may have a variety of stoichiometries which may be determined by the method of forming the aluminum oxide. Prior to the first etch operation, aluminum oxide is formed on a patterned substrate. The aluminum oxide forms exposed portions of the patterned substrate. The substrate is placed in a substrate processing region (operation 110).

A flow of molecular chlorine ($Cl_2$) is introduced into a remote plasma region separate from the substrate processing region during operation 120. Methane is also flowed into the remote plasma region and combined with the molecular chlorine (operation 120). Other sources of chlorine may be used to augment or replace the molecular chlorine. In general, a chlorine-containing precursor may be flowed into the remote plasma region in embodiments. The chlorine-containing precursor may include one or more of atomic chlorine, molecular chlorine ($Cl_2$), hydrogen chloride (HCl), or boron trichloride ($BCl_3$) in embodiments. The chlorine-containing precursor may be a boron-and-chlorine-containing precursor according to embodiments, such as boron trichloride ($BCl_3$), $BCl(CH_3)_2$ or $BCl_2(CH_3)$. The chlorine-containing precursor may be a carbon-and-chlorine-containing precursor according to embodiments, such as $BCl(CH_3)_2$, $BCl_2(CH_3)$ or $CCl_4$. The chlorine-containing precursor may be devoid of carbon and/or boron in embodiments. The chlorine-containing precursor may be devoid of fluorine according to embodiments.

Generally speaking, a hydrocarbon may be used to augment or replace the methane of etch process 101. The hydrocarbon may be a hydrogen-and-carbon-containing precursor which may contain elements other than hydrogen and carbon in embodiments. The hydrogen-and-carbon-containing precursor may be halogen-free, chlorine-free or fluorine-free in embodiments. According to embodiments, the hydrogen-and-carbon-containing precursor may consist only of hydrogen and carbon. The hydrogen-and-carbon-containing precursor may be one of methane, ethane, propane or a higher order saturated alkane. The radical-hydrogen-carbon is the portion of the plasma effluents produced from the excitation of the hydrogen-and-carbon-containing precursor. The radical-hydrogen-carbon may be halogen-free, chlorine-free or fluorine-free according to embodiments.

Including fluorine in the chlorine-containing precursor or the hydrogen-and-carbon-containing precursor may form Al—F complexes on the patterned substrate. Al—F complexes may not be volatile and so may stay of the surface of the patterned substrate and inhibit aluminum oxide selective etch process 101. Al—F complexes are also thought to be energetically very favorable and so will likely form with high reaction probability.

The separate plasma region may be referred to as a remote plasma region herein and may be within a distinct module from the substrate processing chamber or a compartment within the substrate processing chamber. The separate plasma region may is fluidly coupled to the substrate processing region by through-holes in a showerhead disposed between the two regions. The hardware just described may also be used in all processes discussed herein.

The plasma effluents formed in the remote plasma region are then flowed into the substrate processing region (operation 130) through the through-holes the showerhead separating the remote plasma region and the substrate processing region. A local plasma power is applied to the substrate processing region in operation 140 and aluminum oxide on the substrate is selectively etched (operation 150) such that aluminum oxide may be removed more rapidly than a variety of other materials in embodiments. The reactive chemical species and any process effluents are removed from the substrate processing region and then the substrate is removed from the substrate processing region (operation 160).

The etch processes disclosed herein remove aluminum oxide without relying on high substrate temperatures. The presence of the hydrogen-and-carbon-containing precursor and the chlorine-containing precursor has been found to remove the aluminum oxide selectively when the substrate temperature is below 130° C., below 100° C., below 70° C., below 40° C. or even below 30° C. according to embodiments. The etch rate of aluminum oxide selective etch process 101 at 20° C. was observed to only be 30% less than the etch rate at 90° C. Aluminum oxide selective etch process 101 is a non-thermal process according to embodiments. The carbon may be weakening the Al—O bond in the aluminum oxide, allowing the chlorine to bond with aluminum to form volatile Al—Cl complexes. The simultaneous availability of the carbon and the chlorine may result in an aluminum oxide etch rate greater than 50 Å/min, greater than 70 Å/min or greater than 90 Å/min in embodiments for a low temperature substrate at about 90° C. or less. The aluminum oxide portions may be in the form of a conformal aluminum oxide layer prior to aluminum oxide selective etch process 101 in embodiments. The conformal aluminum oxide layer may be functional and not simply a byproduct of exposing aluminum to atmosphere in embodiments. As such, the thickness of the conformal aluminum oxide layer may be greater than 100 Å, greater than 200 Å or greater than 400 Å according to embodiments.

The processes disclosed herein display etch selectivities of aluminum oxide relative to a variety of other materials even at the low patterned substrate temperatures. The etch selectivity of aluminum oxide relative to silicon (including single crystal, polysilicon or amorphous silicon) may be greater than or about 10:1, greater than or about 15:1, greater than or about 20:1 or greater than or about 25:1 in embodiments. The etch selectivity of aluminum oxide relative to silicon nitride may be greater than or about 10:1, greater than or about 15:1, greater than or about 20:1 or greater than or about 25:1 in embodiments. The etch selectivity of aluminum oxide relative to select metal oxides (e.g. hafnium oxide) may be greater than or about 15:1, greater than or about 20:1, greater than or about 25:1 or greater than or about 40:1 in embodiments. High etch selectivities of aluminum oxide relative to these materials are helpful in enabling new process flows which may include forming aluminum oxide spacers or other novel features. The achievement of high etch selectivities at low substrate temperatures enables the thermal budget to be allocated elsewhere in the semiconductor manufacturing process flow.

In embodiments, the chlorine-containing precursor (e.g. $Cl_2$) is supplied at a flow rate of between 5 sccm and 500 sccm, between 10 sccm and 300 sccm, between 25 sccm and 200 sccm, between 50 sccm and 150 sccm or between 75 sccm and 125 sccm. The hydrogen-and-carbon-containing precursor (e.g. $CH_4$) is supplied at a flow rate of between 1 sccm and 200 sccm, between 2 sccm and 100 sccm, between 5 sccm and 75 sccm, between 10 sccm and 50 sccm or between 20 sccm and 40 sccm according to embodiments. The hydrogen-and-carbon-containing precursor (e.g. $CH_4$) is supplied at a flow rate (or partial pressure) of between 1% and 100%, between 5% and 75%, between 10% and 50%, or between 20% and 40% of the chlorine-containing precursor flow rate (or partial pressure) in embodiments. Too low or too high a hydrogen-and-carbon-containing precursor flow rate/partial pressure results in an undesirably low etch rate of the aluminum oxide as discussed in more detail shortly. However, the latitude in choosing the flow rate ratio (known as the process window) is high and a large process window is desirable for manufacturing processes such as these.

The method also includes applying energy to the combination of the hydrogen-and-carbon-containing precursor and the chlorine-containing precursor in the remote plasma region to generate the plasma effluents. The remote plasma may be generated using known techniques (e.g., radio frequency excitations, capacitively-coupled power, inductively-coupled power). In an embodiment, the remote plasma power is applied capacitively. The remote plasma power may be between about 100 watts and about 3000 watts, between about 200 watts and about 2000 watts, between about 300 watts and about 1000 watts in embodiments.

A low-intensity plasma is also applied in the substrate processing region to create a low ion density and direct the ions toward the substrate to remove the aluminum oxide. A plasma in the substrate processing region may also be referred to as a bias plasma because ions are accelerated towards the substrate to assist the process. The bias plasma in the substrate processing region may be applied capacitively, in embodiments. The bias plasma may be applied concurrently with the remote plasma according to embodiments. The bias plasma may be applied with a bias power which is between 10% and 100% of the remote plasma power, between 20% and 90% of the remote plasma power or between 25% and 70% of the remote plasma power in embodiments. In embodiments, the bias power may be between 50 watts and 1500 watts, between 100 watts and 1000 watts or between 150 watts and 500 watts according to embodiments.

Figure 2A:
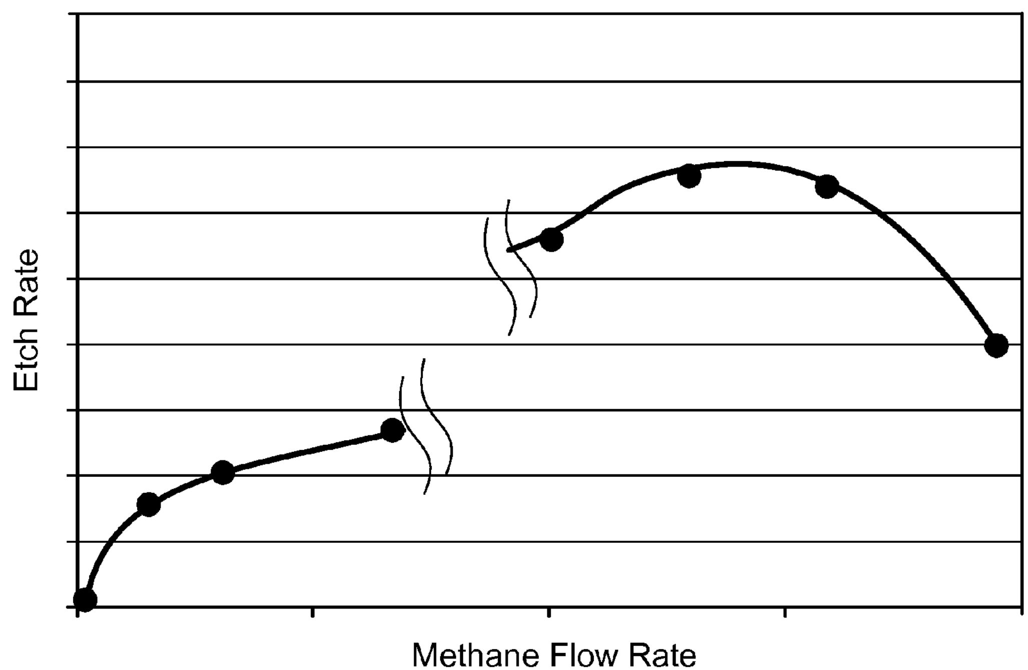
FIGS. 2A, 2B, 2C and 2D are charts of etch rate dependence on process parameters according to disclosed embodiments.

FIG. 2A is a chart of aluminum oxide etch rate dependence on methane flow rate into the remote plasma region during aluminum oxide selective etch process 101. The etch rate is immeasurable if methane is not included as indicated by the etch rate at the extreme left of the figure. The etch rate increases monotonically up to a point and then is reduced possibly due to the formation of polymers on the exposed aluminum oxide portions of the patterned substrate. The rate of formation of polymers on the surface of the patterned substrate may be removed (and the process may proceed) but only when the hydrogen-and-carbon-containing precursor is flowed or present in specific ranges relative the chlorine-containing precursor as indicated previously.

Figure 2B:
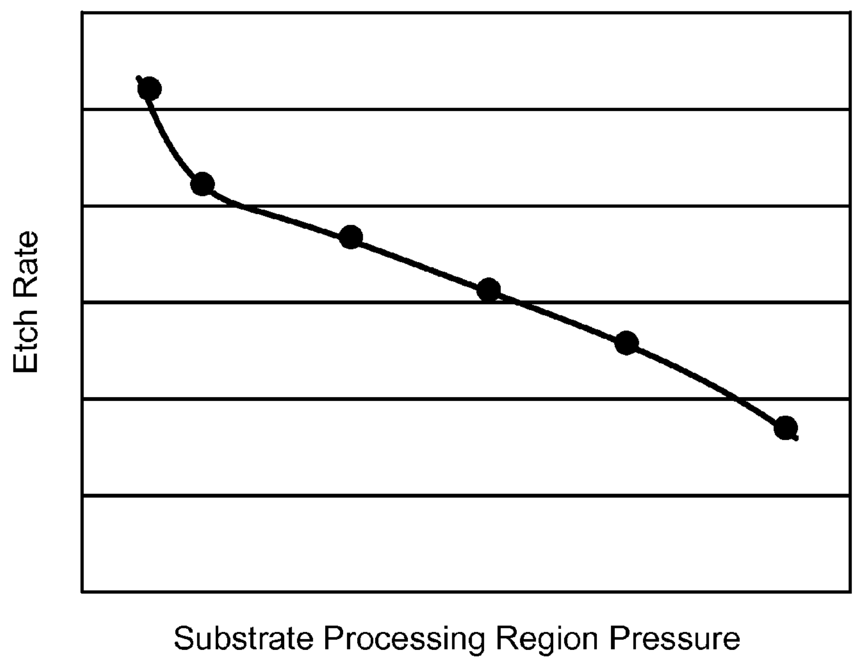

FIG. 2B is a chart of aluminum oxide etch rate dependence on pressure in the substrate processing region during aluminum oxide selective etch process 101. The etch rate reduces as the process pressure is increased across the approximate range from 0.1 Torr to 10 Torr. This dependence indicates that the process depends on a large mean free path and the removal mechanism may be activated by impingement energy of the etchants activated, lastly, in the bias plasma. Lower process pressures are preferred for the aluminum oxide etch processes described herein. During aluminum oxide selective etch process 101, the pressure within the substrate processing region may be below 10 Torr, below 3 Torr, below 2 Torr, or below 1 Torr according to embodiments. The pressure may be between 0.01 Torr and 1.0 Torr, or between 0.02 Torr and 0.5 Torr or preferably between 0.05 Torr and 0.2 Torr in embodiments.

Figure 2C:
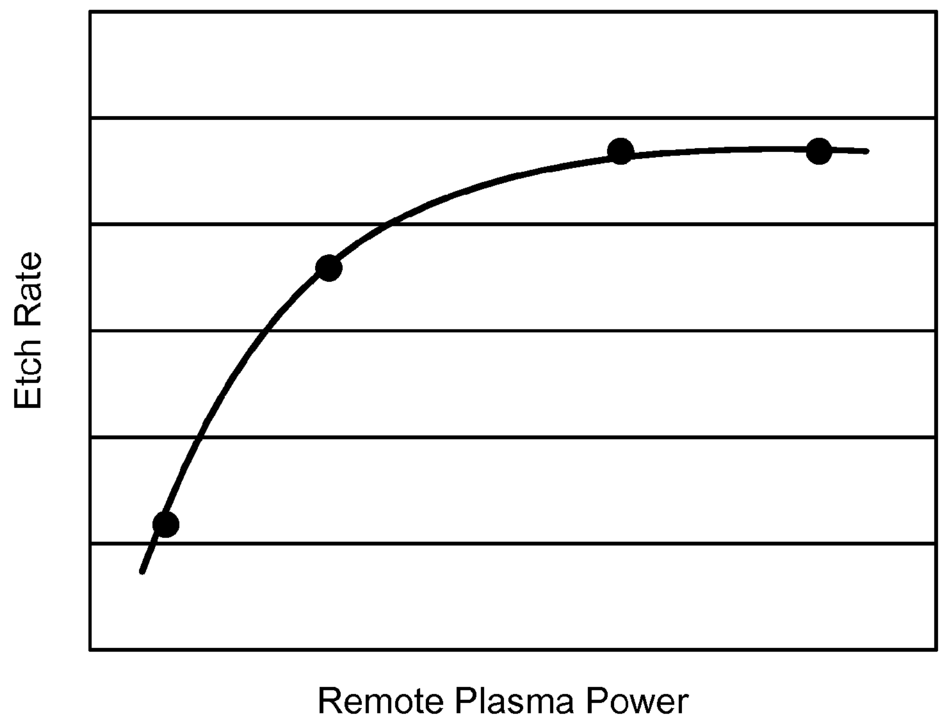
Figure 2D:
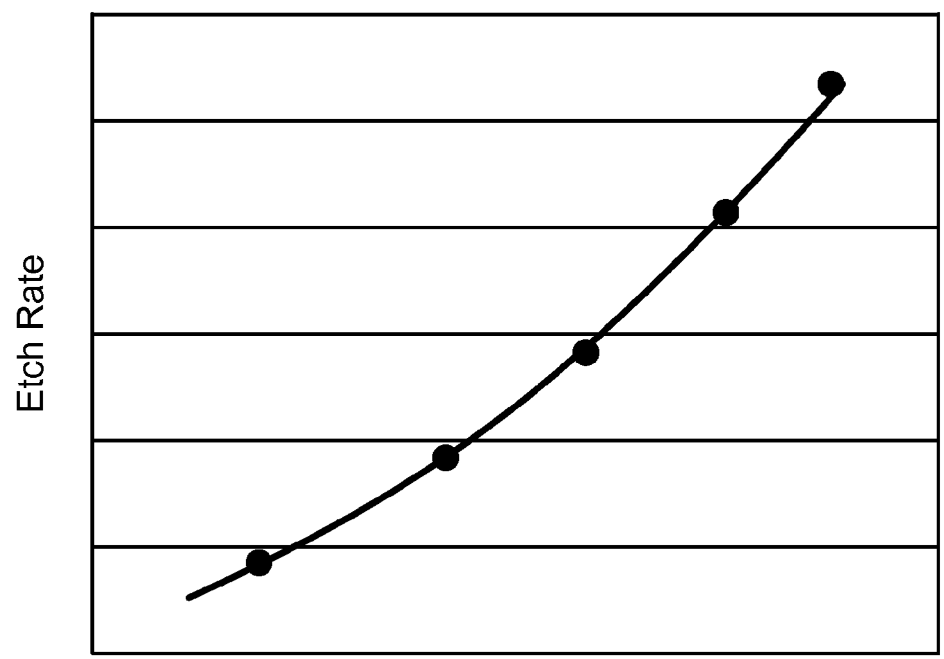

FIGS. 2C and 2D are charts of aluminum oxide etch rate dependence on plasma power in the remote plasma region and in the substrate processing region during aluminum oxide selective etch process 101, respectively. While varying the remote plasma power for FIG. 2C, the bias plasma power was maintained at 180 watts. While varying the bias plasma power for FIG. 2D, the remote plasma power was maintained at 300 watts. Both values were selected to achieve at least 80% of the maximum aluminum oxide etch rate shown in the FIGS. 2C and 2D. Inferring from FIGS. 2C-2D, both the remote plasma power and the bias plasma power are necessary (must be non-zero) to enable aluminum oxide selective etch process 101 to proceed. The remote plasma power saturates the aluminum oxide etch rate after about 300 watts and the bias plasma power exhibits shows a second-order component indicating an accelerating influence of the aluminum oxide etch rate with bias plasma power.

The etch rate may increase using etch-purge-etch and etch-purge-etch cycles. Therefore, the etching operations of all processes may have a pause in the flow and/or concentration of precursors in the remote plasma and the substrate processing region during the processes disclosed and claimed herein. The remote plasma region and/or the substrate processing region may be actively purged using a gas which displays essentially no chemical reactivity to the exposed materials on the patterned substrate. After purging the regions the flows of precursors may be resumed to restart the removal of aluminum oxide from the patterned substrate at a rejuvenated or renewed etch rate (which may be the same or similar to the initial etch rate of the etch process).

The aluminum oxide portions etched herein may contain aluminum and oxygen (and not just any specific example of stoichiometric aluminum oxide). The remote plasma etch processes may remove aluminum oxide which includes an atomic concentration of about 20% or more aluminum and about 60% or more oxygen in embodiments. The aluminum oxide may consist essentially of aluminum and oxygen, allowing for small dopant concentrations and other undesirable or desirable minority additives, in embodiments. Aluminum oxide may have roughly an atomic ratio 2:3 (Al:O). The aluminum oxide may contain between 30% and 50% aluminum and may contain between 50% and 70% oxygen in embodiments.

Advantages of the processes described herein relate to tuning the anisotropy of aluminum oxide selective etch 101. Aluminum oxide selective etch 101 may be conformal with some process parameter combinations (e.g. higher pressure and/or lower bias power/voltage) or directional (e.g. with lower pressures and/or higher bias power/voltage). This flexibility is enabled because aluminum oxide selective etch 101 does not rely on a traditionally high bias power to accelerate etchants towards the substrate. The anisotropic etch process disclosed herein may open the door to new process sequences which use aluminum oxide as a spacer material. Anisotropic/directional etch processes can remove material from the top of features and from the bottom of trenches while leaving sidewall material behind. In contrast, a conformal etch process refers to a generally uniform removal rate of material from a patterned surface regardless of the shape of the surface. In a conformal etch process the aluminum oxide on the top, the bottom and on the sidewalls may all be removed according to embodiments. The surface of the layer before and after the etch process are generally parallel. A person having ordinary skill in the art will recognize that the etch process likely cannot be 100% conformal and thus the term "generally" allows for acceptable tolerances. A conformal etch may be interchangeably referred to as an isotropic etch. Generally speaking, increasing pressure in the substrate processing region will increase conformality and increasing bias plasma power as a percentage of remote plasma power will increase anisotropy of aluminum oxide selective etch process 101.

In each remote plasma or local plasma described herein, the flows of the precursors into the remote plasma region may further include one or more relatively inert gases such as He, $N_2$, Ar. The inert gas can be used to improve plasma stability, ease plasma initiation, and improve process uniformity. Argon is helpful, as an additive, to promote the formation of a stable plasma. Process uniformity is generally increased when helium is included. These additives are present in embodiments throughout this specification. Flow rates and ratios of the different gases may be used to control etch rates and etch selectivity.

In embodiments, an ion suppressor as described in the exemplary equipment section may be used to provide radical and/or neutral species for selectively etching substrates. The ion suppressor may also be referred to as an ion suppression element. In embodiments, for example, the ion suppressor is used to filter chlorine-containing plasma effluents and hydrogen-and-carbon-containing plasma effluents to selectively etch aluminum oxide. The ion suppressor may be included in each exemplary process described herein. Using the plasma effluents, an etch rate selectivity of aluminum oxide to a wide variety of materials may be achieved.

The ion suppressor may be used to provide a reactive gas having a higher concentration of radicals than ions. The ion suppressor functions to dramatically reduce or substantially eliminate ionically charged species traveling from the plasma generation region to the substrate. The electron temperature may be measured using a Langmuir probe in the substrate processing region during excitation of a plasma in the remote plasma region on the other side of the ion suppressor. In embodiments, the electron temperature may be less than 0.5 eV, less than 0.45 eV, less than 0.4 eV, or less than 0.35 eV. These extremely low values for the electron temperature are enabled by the presence of the showerhead and/or the ion suppressor positioned between the substrate processing region and the remote plasma region. Uncharged neutral and radical species may pass through the openings in the ion suppressor to react at the substrate. Because most of the charged particles of a plasma are filtered or removed by the ion suppressor, the substrate is not necessarily biased during the etch process. Such a process using radicals and other neutral species can reduce plasma damage compared to conventional plasma etch processes that include sputtering and bombardment. The ion suppressor helps control the concentration of ionic species in the reaction region at a level that assists the process. Embodiments of the present invention are also advantageous over conventional wet etch processes where surface tension of liquids can cause bending and peeling of small features.

Figure 3A:
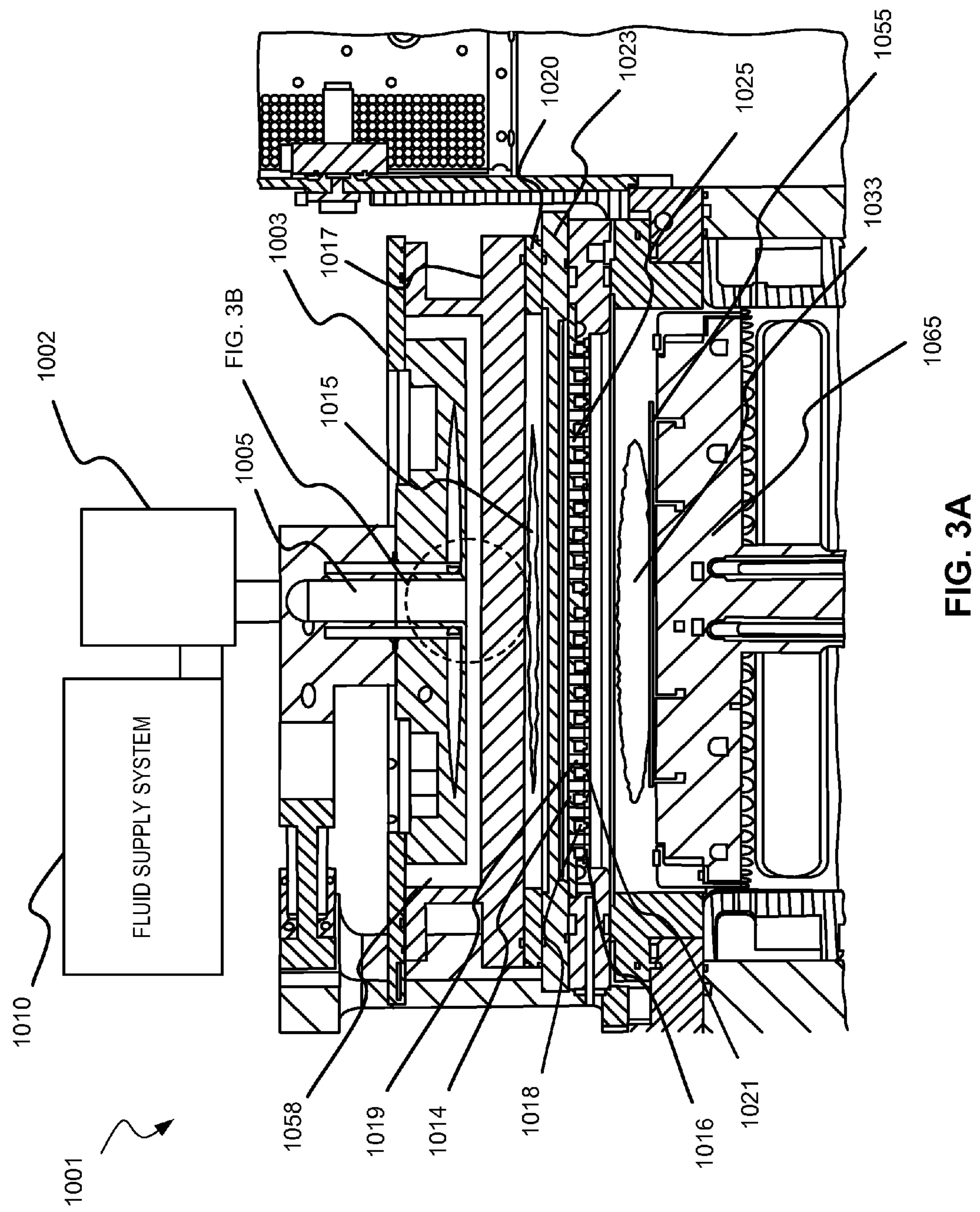
FIG. 3A shows a schematic cross-sectional view of a substrate processing chamber according to embodiments.

FIG. 3A shows a cross-sectional view of an exemplary substrate processing chamber 1001 with a partitioned plasma generation region within the processing chamber. During film etching, a process gas may be flowed into chamber plasma region 1015 through a gas inlet assembly 1005. A remote plasma system (RPS) 1002 may optionally be included in the system, and may process a first gas which then travels through gas inlet assembly 1005. The process gas may be excited within RPS 1002 prior to entering chamber plasma region 1015. Accordingly, the chlorine-containing precursor as discussed above, for example, may pass through RPS 1002 or bypass the RPS unit in embodiments.

A cooling plate 1003, faceplate 1017, ion suppressor 1023, showerhead 1025, and a substrate support 1065 (also known as a pedestal), having a substrate 1055 disposed thereon, are shown and may each be included according to embodiments. Pedestal 1065 may have a heat exchange channel through which a heat exchange fluid flows to control the temperature of the substrate. This configuration may allow the substrate 1055 temperature to be cooled or heated to maintain relatively low temperatures, such as between −20° C. to 200° C. Pedestal 1065 may also be resistively heated to relatively high temperatures, such as between 100° C. and 1100° C., using an embedded heater element.

Exemplary configurations may include having the gas inlet assembly 1005 open into a gas supply region 1058 partitioned from the chamber plasma region 1015 by faceplate 1017 so that the gases/species flow through the holes in the faceplate 1017 into the chamber plasma region 1015. Structural and operational features may be selected to prevent significant backflow of plasma from the chamber plasma region 1015 back into the supply region 1058, gas inlet assembly 1005, and fluid supply system 1010. The structural features may include the selection of dimensions and cross-sectional geometries of the apertures in faceplate 1017 to deactivate back-streaming plasma. The operational features may include maintaining a pressure difference between the gas supply region 1058 and chamber plasma region 1015 that maintains a unidirectional flow of plasma through the showerhead 1025. The faceplate 1017, or a conductive top portion of the chamber, and showerhead 1025 are shown with an insulating ring 1020 located between the features, which allows an AC potential to be applied to the faceplate 1017 relative to showerhead 1025 and/or ion suppressor 1023. The insulating ring 1020 may be positioned between the faceplate 1017 and the showerhead 1025 and/or ion suppressor 1023 enabling a capacitively coupled plasma (CCP) to be formed in the first plasma region.

The plurality of holes in the ion suppressor 1023 may be configured to control the passage of the activated gas: the ionic, radical, and/or neutral species, through the ion suppressor 1023. For example, the aspect ratio of the holes, or the hole diameter to length, and/or the geometry of the holes may be controlled so that the flow of ionically-charged species in the activated gas passing through the ion suppressor 1023 is reduced. The holes in the ion suppressor 1023 may include a tapered portion that faces chamber plasma region 1015, and a cylindrical portion that faces the showerhead 1025. The cylindrical portion may be shaped and dimensioned to control the flow of ionic species passing to the showerhead 1025. An adjustable electrical bias may also be applied to the ion suppressor 1023 as an additional means to control the flow of ionic species through the suppressor. The ion suppression element 1023 may function to reduce or eliminate the amount of ionically charged species traveling from the plasma generation region to the substrate. Uncharged neutral and radical species may still pass through the openings in the ion suppressor to react with the substrate.

Plasma power can be of a variety of frequencies or a combination of multiple frequencies. In the exemplary processing system the plasma may be provided by RF power delivered to faceplate 1017 relative to ion suppressor 1023 and/or showerhead 1025. The RF power may be between about 10 watts and about 5000 watts, between about 100 watts and about 2000 watts, between about 200 watts and about 1500 watts, or between about 200 watts and about 1000 watts in embodiments. The RF frequency applied in the exemplary processing system may be low RF frequencies less than about 200 kHz, high RF frequencies between about 10 MHz and about 15 MHz, or microwave frequencies greater than or about 1 GHz in embodiments. The plasma power may be capacitively-coupled (CCP) or inductively-coupled (ICP) into the remote plasma region.

A precursor, for example a chlorine-containing precursor, may be flowed into substrate processing region 1033 by embodiments of the showerhead described herein. Excited species derived from the process gas in chamber plasma region 1015 may travel through apertures in the ion suppressor 1023, and/or showerhead 1025 and react with an additional precursor flowing into substrate processing region 1033 from a separate portion of the showerhead. Alternatively, if all precursor species are being excited in chamber plasma region 1015, no additional precursors may be flowed through the separate portion of the showerhead. A small bias plasma may be present in substrate processing region 1033 during the remote plasma etch process. Excited derivatives of the precursors may combine in the region above the substrate and/or on the substrate to etch structures or remove species from the substrate.

The processing gases may be excited in chamber plasma region 1015 and may be passed through the showerhead 1025 to substrate processing region 1033 in the excited state. While a plasma may be generated in substrate processing region 1033, a plasma may alternatively not be generated in the processing region. In one example, the only excitation of the processing gas or precursors may be from exciting the processing gases in chamber plasma region 1015 to react with one another in substrate processing region 1033. As previously discussed, this may be to protect the structures patterned on substrate 1055.

Figure 3B:
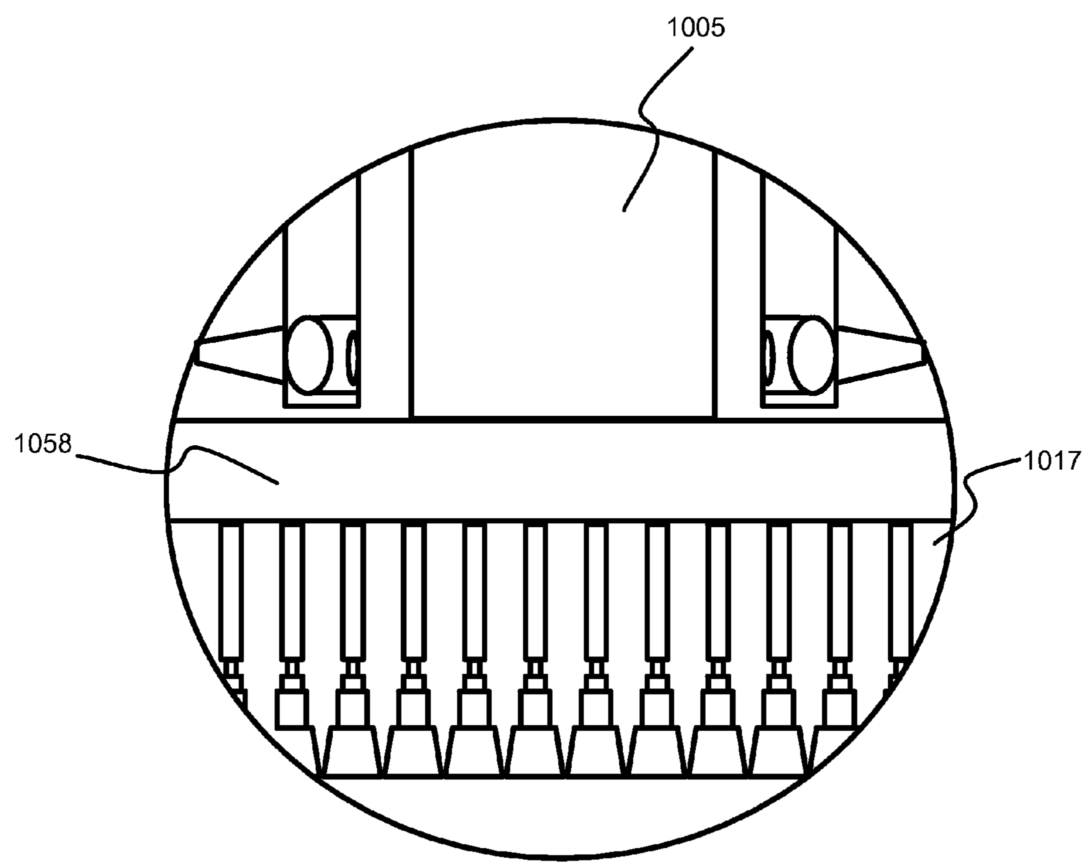
FIG. 3B shows a schematic cross-sectional view of a portion of a substrate processing chamber according to embodiments.

FIG. 3B shows a detailed view of the features affecting the processing gas distribution through faceplate 1017. The gas distribution assemblies such as showerhead 1025 for use in the processing chamber section 1001 may be referred to as dual channel showerheads (DCSH) and are additionally detailed in the embodiments described in FIG. 3A as well as FIG. 3C herein. The dual channel showerhead may provide for etching processes that allow for separation of etchants outside of the processing region 1033 to provide limited interaction with chamber components and each other prior to being delivered into the processing region.

The showerhead 1025 may comprise an upper plate 1014 and a lower plate 1016. The plates may be coupled with one another to define a volume 1018 between the plates. The coupling of the plates may be so as to provide first fluid channels 1019 through the upper and lower plates, and second fluid channels 1021 through the lower plate 1016. The formed channels may be configured to provide fluid access from the volume 1018 through the lower plate 1016 via second fluid channels 1021 alone, and the first fluid channels 1019 may be fluidly isolated from the volume 1018 between the plates and the second fluid channels 1021. The volume 1018 may be fluidly accessible through a side of the gas distribution assembly 1025. Although the exemplary system of FIGS. 3A-3C includes a dual-channel showerhead, it is understood that alternative distribution assemblies may be utilized that maintain first and second precursors fluidly isolated prior to substrate processing region 1033. For example, a perforated plate and tubes underneath the plate may be utilized, although other configurations may operate with reduced efficiency or not provide as uniform processing as the dual-channel showerhead as described.

In the embodiment shown, showerhead 1025 may distribute via first fluid channels 1019 process gases which contain plasma effluents upon excitation by a plasma in chamber plasma region 1015. In embodiments, the process gas introduced into RPS 1002 and/or chamber plasma region 1015 may contain chlorine, e.g., $Cl_2$ or $BCl_3$. The process gas may also include a carrier gas such as helium, argon, nitrogen ($N_2$), etc. Plasma effluents may include ionized or neutral derivatives of the process gas and may also be referred to herein as a radical-chlorine precursor referring to the atomic constituent of the process gas introduced.

Figure 3C:
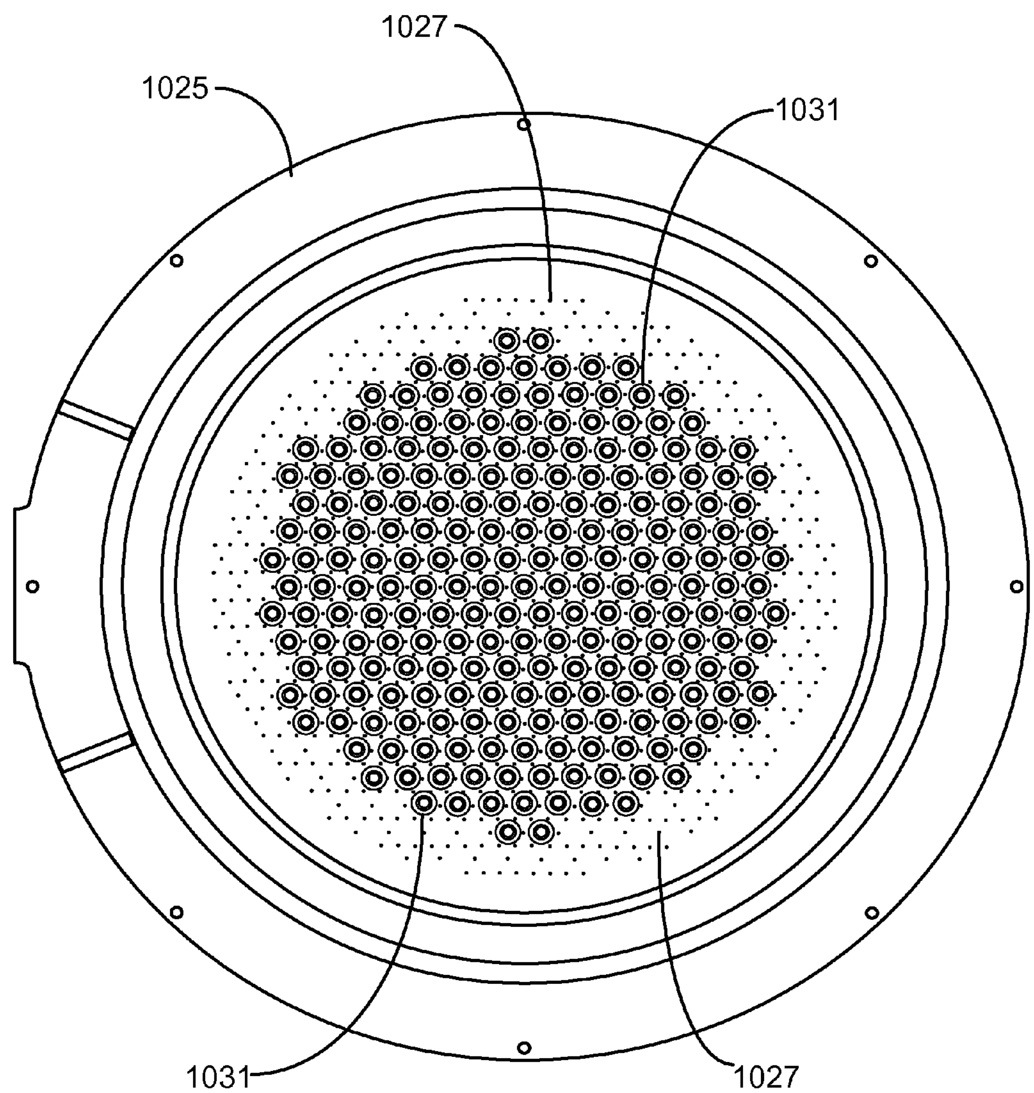
FIG. 3C shows a bottom view of a showerhead according to embodiments.

FIG. 3C is a bottom view of a showerhead 1025 for use with a processing chamber in embodiments. Showerhead 1025 corresponds with the showerhead shown in FIG. 3A. Through-holes 1031, which show a view of first fluid channels 1019, may have a plurality of shapes and configurations to control and affect the flow of precursors through the showerhead 1025. Small holes 1027, which show a view of second fluid channels 1021, may be distributed substantially evenly over the surface of the showerhead, even amongst the through-holes 1031, which may help to provide more even mixing of the precursors as they exit the showerhead than other configurations.

The chamber plasma region 1015 or a region in an RPS may be referred to as a remote plasma region. In embodiments, the radical precursor, e.g., a radical-chlorine precursor, is created in the remote plasma region and travels into the substrate processing region where it may or may not combine with additional precursors. In embodiments, the additional precursors are excited only by the radical-chlorine precursor. Plasma power may essentially be applied only to the remote plasma region in embodiments to ensure that the radical-chlorine precursor provides the dominant excitation.

Combined flow rates of precursors into the chamber may account for 0.05% to about 20% by volume of the overall gas mixture; the remainder being carrier gases. The chlorine-containing precursor may be flowed into the remote plasma region, but the plasma effluents may have the same volumetric flow ratio in embodiments. In the case of the chlorine-containing precursor, a purge or carrier gas may be first initiated into the remote plasma region before the chlorine-containing gas to stabilize the pressure within the remote plasma region. Substrate processing region 1033 can be maintained at a variety of pressures during the flow of precursors, any carrier gases, and plasma effluents into substrate processing region 1033.

Figure 4:
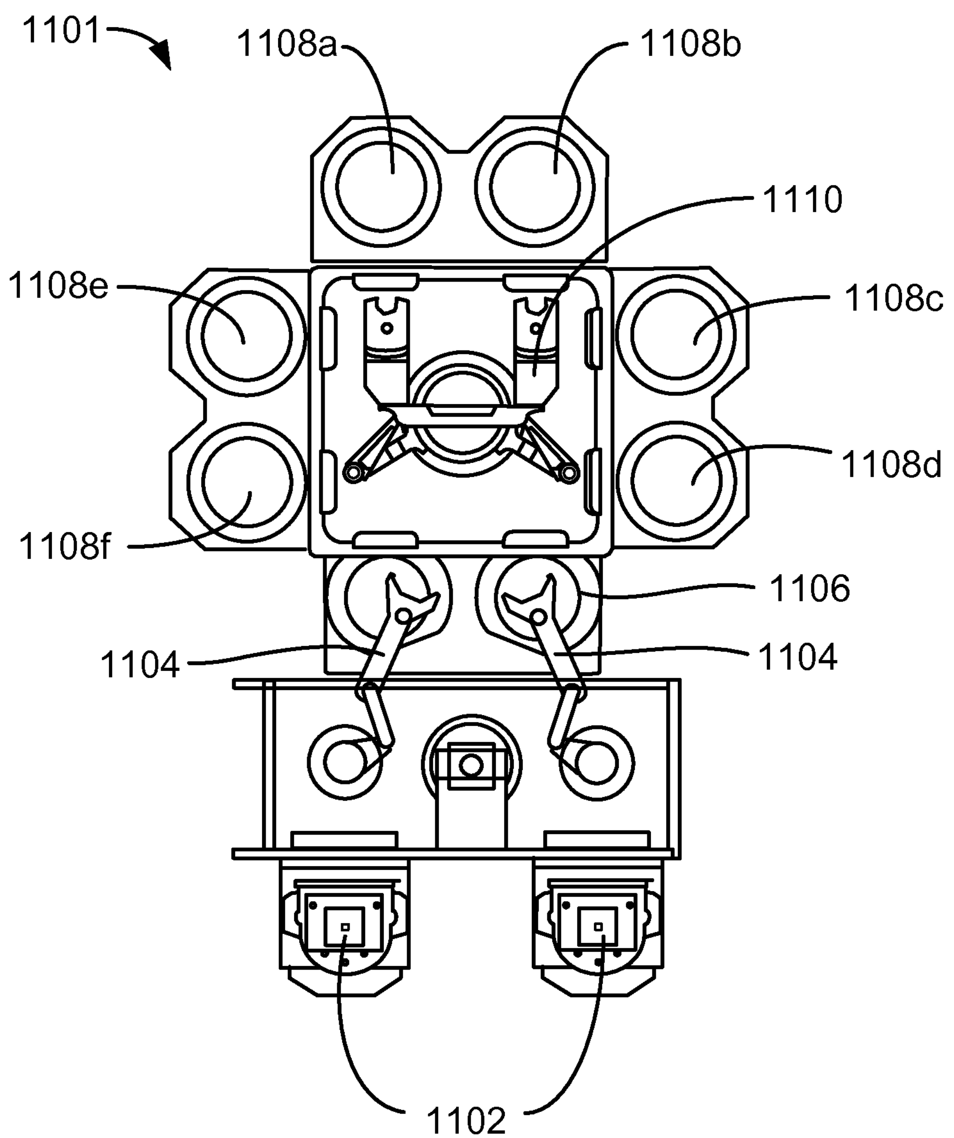
FIG. 4 shows a top view of an exemplary substrate processing system according to embodiments.

Embodiments of the dry etch systems may be incorporated into larger fabrication systems for producing integrated circuit chips. FIG. 4 shows one such processing system (mainframe) 1101 of deposition, etching, baking, and curing chambers in embodiments. In the figure, a pair of front opening unified pods (load lock chambers 1102) supply substrates of a variety of sizes that are received by robotic arms 1104 and placed into a low pressure holding area 1106 before being placed into one of the substrate processing chambers 1108*a-f*. A second robotic arm 1110 may be used to transport the substrate wafers from the holding area 1106 to the substrate processing chambers 1108*a-f* and back. Each substrate processing chamber 1108*a-f*, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 1108*a-f* may be configured for depositing, annealing, curing and/or etching a film on the substrate wafer. In one configuration, all three pairs of chambers, e.g., 1108*a-f*, may be configured to etch a film on the substrate, for example, chambers 1108*a-d* may be used to etch the gapfill silicon oxide to create space for the airgap while chambers 1108*e-f* may be used to etch the polysilicon.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon" or "polysilicon" of the patterned substrate is predominantly Si but may include minority concentrations of other elemental constituents such as nitrogen, oxygen, hydrogen and carbon. Exposed "silicon" or "polysilicon" may consist of or consist essentially of silicon. Exposed "silicon nitride" of the patterned substrate is predominantly silicon and nitrogen but may include minority concentrations of other elemental constituents such as oxygen, hydrogen and carbon. "Exposed silicon nitride" may consist essentially of or consist of silicon and nitrogen. Exposed "silicon oxide" of the patterned substrate is predominantly $SiO_2$ but may include minority concentrations of other elemental constituents (e.g. nitrogen, hydrogen, carbon). In some embodiments, silicon oxide films etched using the methods disclosed herein consist essentially of silicon and oxygen. "Aluminum oxide" is predominantly aluminum and oxygen but may include minority concentrations of other elemental constituents (e.g. nitrogen, hydrogen, carbon). Aluminum oxide may consist essentially of aluminum and oxygen. "Aluminum" is predominantly aluminum but may include minority concentrations of other elemental constituents (e.g. nitrogen, hydrogen, oxygen, carbon). Aluminum oxide may consist essentially of aluminum. Analogous definitions will be understood for other metal-containing materials such as hafnium oxide.

The term "precursor" is used to refer to any process gas which takes part in a reaction to either remove material from or deposit material onto a surface. "Plasma effluents" describe gas exiting from the chamber plasma region and entering the substrate processing region. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate in a reaction to either remove material from or deposit material on a surface. "Radical-chlorine" are radical precursors which contain chlorine but may contain other elemental constituents. "Radical-hydrogen-carbon" are radical precursors which contain hydrogen and carbon but may contain other elemental constituents. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The terms "gap" and "trench" are used throughout with no implication that the etched geometry has a large horizontal aspect ratio. Viewed from above the surface, trenches may appear circular, oval, polygonal, rectangular, or a variety of other shapes. A trench may be in the shape of a moat around an island of material. The term "via" is used to refer to a low aspect ratio trench (as viewed from above) which may or may not be filled with metal to form a vertical electrical connection. As used herein, a conformal etch process refers to a generally uniform removal of material on a surface in the same shape as the surface. The surface of the etched layer and the pre-etch surface are generally parallel. A person having ordinary skill in the art will recognize that the etched interface likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the disclosed embodiments. Additionally, a number of well known processes and elements have not been described to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of etching aluminum oxide, the method comprising:

placing a patterned substrate in a substrate processing region of a substrate processing chamber, wherein the patterned substrate comprises an exposed aluminum oxide portion;

flowing a chlorine-containing precursor into a remote plasma region fluidly coupled to the substrate processing region;

flowing a hydrogen-and-carbon-containing precursor into the remote plasma region;

forming a remote plasma in the remote plasma region from the chlorine-containing precursor and the hydrogen-and-carbon-containing precursor to produce plasma effluents;

flowing the plasma effluents into the substrate processing region through through-holes in a showerhead, wherein the showerhead is disposed between the remote plasma region and the substrate processing chamber;

forming a bias plasma in the substrate processing region to further excite the plasma effluents; and etching the exposed aluminum oxide portion from the patterned substrate, wherein a temperature of the patterned substrate is below 130° C. during the operation of etching the exposed aluminum oxide portion.

2. The method of claim 1 wherein the chlorine-containing precursor comprises one or more of atomic chlorine, molecular chlorine ($Cl_2$), hydrogen chloride (HCl), or boron trichloride ($BCl_3$).

3. The method of claim 1 wherein the chlorine-containing precursor is devoid of carbon.

4. The method of claim 1 wherein the hydrogen-and-carbon-containing precursor is an alkane.

5. The method of claim 1 wherein a bias plasma power of the bias plasma is between 25% and 70% of a remote plasma power of the remote plasma.

6. The method of claim 1 wherein the hydrogen-and-carbon-containing precursor is chlorine-free.

7. The method of claim 1 further comprising purging reactants from the substrate processing region and reintroducing the reactants to the substrate processing region to etch the exposed aluminum oxide portion again, wherein the etch rate of the exposed aluminum oxide portion is restored to previous levels.

8. The method of claim 1 wherein a pressure in the substrate processing region is between 0.01 Torr and 1.0 Torr during the operation of etching the exposed aluminum oxide portion.

9. The method of claim 1 wherein the hydrogen-and-carbon-containing precursor is fluorine-free.

10. A method of etching aluminum oxide, the method comprising:

placing a patterned substrate in a substrate processing region of a substrate processing chamber, wherein the patterned substrate comprises an exposed aluminum oxide portion;

flowing radical-chlorine into the substrate processing region;

flowing radical-hydrogen-carbon into the substrate processing region;

forming a bias plasma in the substrate processing region to excite the radical-chlorine and the radical-hydrogen-carbon; and etching the exposed aluminum oxide portion from the patterned substrate, wherein a temperature of the patterned substrate is below 130° C. during the operation of etching the exposed aluminum oxide portion.

11. The method of claim 10 wherein the radical-hydrogen-carbon is halogen-free.

12. The method of claim 10 wherein the operation of etching the exposed aluminum oxide portion is an isotropic etch.

13. The method of claim 10 wherein the operation of etching the exposed aluminum oxide portion is an anisotropic etch.

14. A method of etching aluminum oxide, the method comprising:

placing a patterned substrate in a substrate processing region of a substrate processing chamber, wherein the patterned substrate comprises an exposed aluminum oxide portion and a second exposed portion of silicon nitride, silicon or hafnium oxide;

combining molecular chlorine with methane in a remote plasma region fluidly coupled to the substrate processing region;

forming a remote plasma in the remote plasma region from the molecular chlorine and the methane to produce plasma effluents which flow into the substrate processing region through through-holes in a showerhead, wherein the showerhead is disposed between the remote plasma region and the substrate processing chamber;

forming a bias plasma in the substrate processing region to further excite the plasma effluents, wherein a pressure in the substrate processing region is between 0.01 Torr and 1.0 Torr during the operation of forming the bias plasma; and etching the exposed aluminum oxide portion from the patterned substrate, wherein a temperature of the patterned substrate is below 130° C. during the operation of etching the aluminum oxide, and wherein the exposed aluminum oxide portion etches at greater than twenty times an etch rate of the second exposed portion.

15. The method of claim 14 wherein the pressure in the substrate processing region is between 0.05 Torr and 0.2 Torr during the operation of forming the bias plasma.

* * * * *